(12) United States Patent
Lee et al.

(10) Patent No.: US 12,211,968 B2
(45) Date of Patent: Jan. 28, 2025

(54) DISPLAY DEVICE

(71) Applicant: Samsung Display Co., LTD., Yongin-si (KR)

(72) Inventors: Tae Hee Lee, Hwaseong-si (KR); Sung Kook Park, Suwon-si (KR); Joo Woan Cho, Seongnam-si (KR); Jin Woo Choi, Seoul (KR); Hae Yun Choi, Hwaseong-si (KR)

(73) Assignee: Samsung Display Co., Ltd., Yongin-si (KR)

(*) Notice: Subject to any disclaimer, the term of this patent is extended or adjusted under 35 U.S.C. 154(b) by 459 days.

(21) Appl. No.: 17/660,304

(22) Filed: Apr. 22, 2022

(65) Prior Publication Data
US 2022/0352447 A1    Nov. 3, 2022

(30) Foreign Application Priority Data
Apr. 29, 2021    (KR) .................. 10-2021-0056034

(51) Int. Cl.
*H01L 33/62*    (2010.01)
*H01L 33/50*    (2010.01)

(52) U.S. Cl.
CPC ............ *H01L 33/62* (2013.01); *H01L 33/505* (2013.01)

(58) Field of Classification Search
CPC ............... H01L 25/167; H01L 25/0753; H01L 2224/49176; H01L 24/49
See application file for complete search history.

(56) References Cited

U.S. PATENT DOCUMENTS

| | | | |
|---|---|---|---|
| 2004/0125197 A1* | 7/2004 | Ogihara | B41J 2/45 257/E25.02 |
| 2005/0094382 A1* | 5/2005 | Lassar | H05K 1/111 361/767 |
| 2007/0029658 A1* | 2/2007 | Peng | G02F 1/13452 257/680 |
| 2012/0119387 A1* | 5/2012 | Katagiri | H01L 24/05 257/E23.079 |
| 2017/0127512 A1* | 5/2017 | Park | H01L 25/167 |
| 2017/0309698 A1 | 10/2017 | Bower et al. | |

FOREIGN PATENT DOCUMENTS

| | | |
|---|---|---|
| KR | 10-2007-0059668 A | 6/2007 |
| KR | 10-1356340 B1 | 1/2014 |
| KR | 10-2017-0051892 A | 5/2017 |
| KR | 10-2237870 B1 | 4/2021 |

* cited by examiner

*Primary Examiner* — Evren Seven
(74) *Attorney, Agent, or Firm* — Lewis Roca Rothgerber Christie LLP

(57) ABSTRACT

There is provided a display device including a display panel including first panel pads arranged along a plurality of rows, each of the rows extending in a first direction in a plan view, wires extending in a second direction crossing the first direction, each of the wires including a first bonding portion attached to a corresponding one of the first panel pads, and a first circuit board including first pads connected to the wires. The first panel pads in a first row of the plurality of rows in a plan view are exposed in the second direction crossing the first direction between the first panel pads in a second row neighboring to the first row of the plurality of rows.

20 Claims, 14 Drawing Sheets

DISPLAY DEVICE

CROSS-REFERENCE TO RELATED APPLICATION

This application claims priority to and the benefit of Korean Patent Application No. 10-2021-0056034 filed on Apr. 29, 2021, in the Korean Intellectual Property Office (KIPO), the entire content of which is incorporated by reference herein.

BACKGROUND

1. Field

The present disclosure relates to a display device.

2. Description of the Related Art

As the information society develops, the demand for display devices for displaying images has increased and diversified. The display device may be a flat panel display such as a liquid crystal display (LCD), a field emission display (FED), or a light emitting display device. Light emitting display devices may include an organic light emitting display device including an organic light emitting diode element as a light emitting element, an inorganic light emitting display device including an inorganic semiconductor element as a light emitting element, or a micro light emitting diode display device including a micro light emitting diode element as a light emitting element.

Recently, head mounted displays (HMDs) including the light emitting display devices have been developed. The head mounted display (HMD) is a spectacle-type monitor device for virtual reality (VR) or augmented reality (AR) that is worn in the form of glasses or a helmet by a user and forms a focus at a distance close to user's eyes in front of the user's eyes.

A high-resolution micro light emitting diode display panel including a micro light emitting diode element is applied to (or used in) the head mounted display. Because the micro light emitting diode element emits light of a single color, the micro light emitting diode display panel may include a wavelength conversion layer for converting a wavelength of light emitted from the micro light emitting diode element in order to display various colors.

SUMMARY

Aspects and features of embodiments of the present disclosure provide a display device capable of preventing a connection failure of a wire connected to a display panel.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to one or more embodiments of the present disclosure, there is provided a display device including a display panel including first panel pads arranged along a plurality of rows, each of the plurality of rows extending in a first direction in a plan view, wires extending in a second direction crossing the first direction, each of the wires including a first bonding portion attached to a corresponding one of the first panel pads, and a first circuit board including first pads connected to the wires. The first panel pads in a first row of the plurality of rows in a plan view are exposed in the second direction between the first panel pads in a second row neighboring the first row of the plurality of rows.

The first panel pads in the first row and the first panel pads in the second row may be arranged at a first pitch along the first direction.

The first pitch may be equal to or smaller than twice a width of one of the first panel pad in the first direction.

The first pitch may be equal to or smaller than twice a width of the first bonding portion in the first direction.

The first panel pads in the first row and the first panel pads in the second row nearest to the first panel pads in the first row may be arranged at a second pitch along the first direction that is smaller than the first pitch.

The first pitch may be twice the second pitch.

The second pitch may be equal to or smaller than a width of one of the first panel pads in the first direction.

A gap between the first panel pads in the first row in the first direction and a gap between the first panel pads in the second row in the first direction may be equal to or smaller than a width of one of the first panel pads.

A width of one of the first panel pads in the first direction may be equal to or greater than a width of the first bonding portion in the first direction.

One of the first panel pads may have a circular shape in a plan view.

One of the first panel pads may have a rhombic shape in a plan view.

The first panel pads may be arranged along a third row adjacent to the second row, and the second row may be between the first row and the third row.

The first panel pads in the first row and the first panel pads in the third row may be arranged at a same pitch.

The first panel pads in the second row may be exposed in the second direction between the first panel pads in the first row and/or the first panel pads in the third row.

Each of the wires may include a connection portion connected to the first bonding portion, and the connection portion may have a loop shape on a cross-section.

The display panel may include a semiconductor circuit substrate including a plurality of pixel circuit units, a light emitting element layer on the semiconductor circuit substrate and including a plurality of light emitting elements, and a wavelength conversion substrate on the light emitting element layer.

Each of the plurality of light emitting elements may include a first semiconductor layer, an active layer on the first semiconductor layer, a second semiconductor layer on the active layer, and a third semiconductor layer on the second semiconductor layer.

A distance from one of the first panel pads in the first row to a corresponding one of the first pads in the second direction may be different from a distance from one of the first panel pads in the second row to a corresponding one of the first pads in the second direction.

A distance from one of the first panel pads in the first row to an edge of the display panel in the second direction may be different from a distance from one of the first panel pads in the second row to the edge of the display panel in the second direction.

According to some embodiments of the present disclosure, there is provided a display device including first pads arranged along a first direction, first panel pads overlapping the first pads in a second direction crossing the first direction, and wires connecting the first panel pads and the first pads to each other. The first panel pads are arranged so that at least a portion of a first panel pad of the first panel pads does not overlap an other first panel pad that is nearest to the first panel pad in the second direction, in a plan view.

According to the aforementioned and other embodiments of the present disclosure, a connection failure of a wire connected to a display panel may be prevented.

BRIEF DESCRIPTION OF THE DRAWINGS

The above and other embodiments and features of the present disclosure will become more apparent by describing embodiments thereof with reference to the attached drawings, in which.

DETAILED DESCRIPTION

Figure 1:
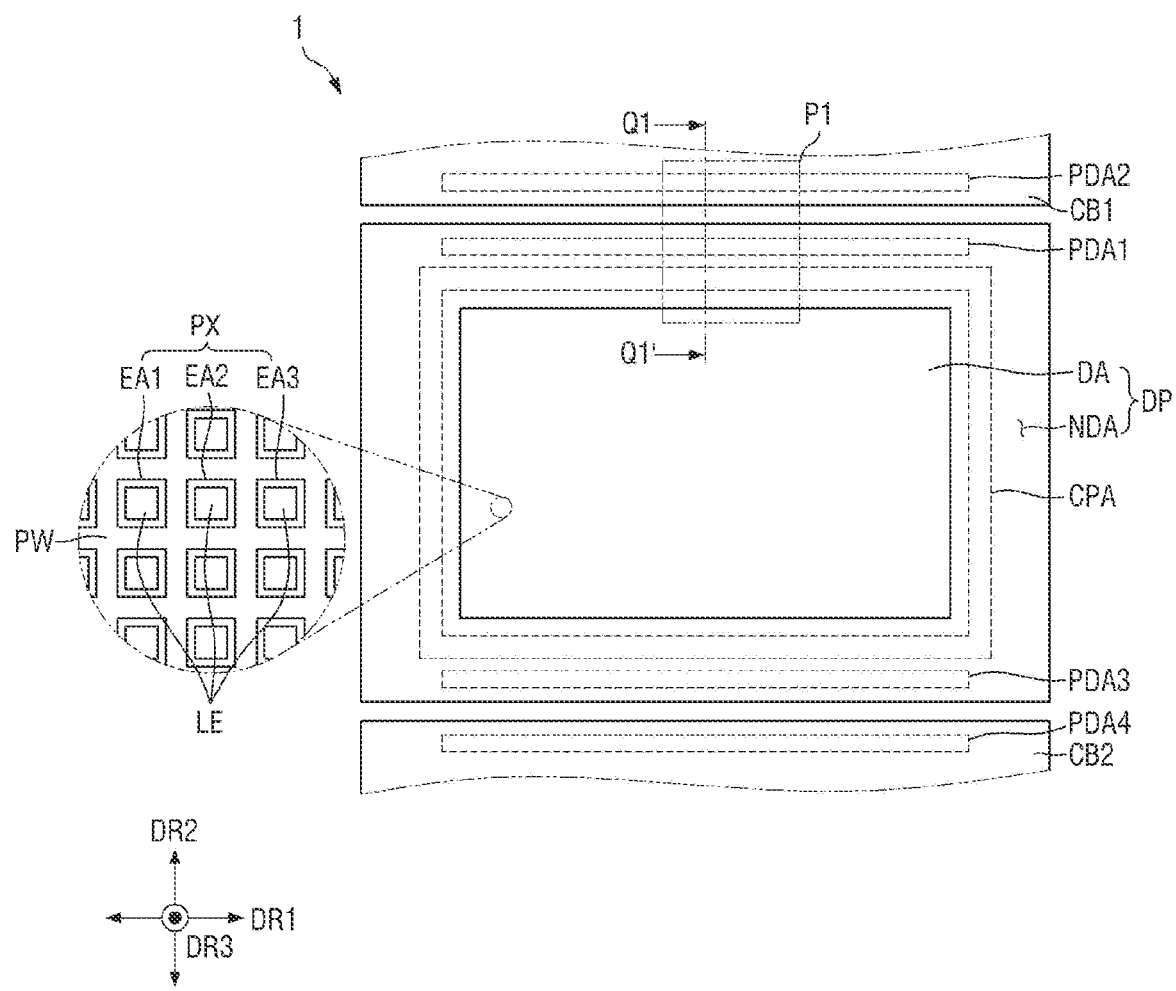
FIG. 1 is a plan view of a display device according to one or more embodiments of the present disclosure.

Aspects and features of one or more embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure might not be described.

Unless otherwise noted, like reference numerals, characters, or combinations thereof denote like elements throughout the attached drawings and the written description, and thus, descriptions thereof will not be repeated. Further, parts not related to the description of some embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept as well as aspects and features of embodiments of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In one or more embodiments of the present disclosure, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of ordinary skill in the art should recognize that the functionality of various computing devices may be combined or integrated into a single computing device, or the functionality of a particular computing device may be distributed across one or more other computing devices without departing from the spirit and scope of embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view of a display device according to one or more embodiments of the present disclosure.

It will be mainly described in the present disclosure that a display device 1 is a micro light emitting diode display device including a micro light emitting diode as a light emitting element, but the present disclosure is not limited thereto.

In addition, it will be mainly described in the present disclosure that the display device 1 is a Light Emitting Diode on Silicon (LEDoS) in which light emitting diodes are disposed on a semiconductor circuit substrate 110 formed using a semiconductor process, but it is to be noted that the present disclosure is not limited thereto.

Hereinafter, a first direction DR1 refers to a horizontal direction of a display panel DP, a second direction DR2 refers to a vertical direction of the display panel DP, and a third direction DR3 refers to a thickness direction of the display panel DP. In this case, "left", "right", "upper", and "lower" indicate directions when the display panel DP is viewed in a plan view. For example, "left" refers to one side in the first direction DR1, "right" refers to the other side in the first direction DR1, "upper side" refers to one side in the second direction DR2, and "lower side" refers to the other side in the second direction DR2. In addition, "upper portion" refers to one side in the third direction DR3, and "lower portion" refers to the other side in the third direction DR3.

Referring to FIG. 1, a display device 1 according to one or more embodiments of the present disclosure includes a display panel DP including a display area DA and a non-display area NDA.

The display panel DP may have a rectangular shape, in a plan view, having long sides in the first direction DR1 and short sides in the second direction DR2. However, the shape of the display panel DP in a plan view is not limited thereto, and the display panel DP may have a polygonal, circular, elliptical, or irregular shape in a plan view other than the rectangular shape.

The display area DA may be an area in which an image is displayed, and the non-display area NDA may be an area in which an image is not displayed. A shape of the display area DA in a plan view may follow the shape of the display panel DP in a plan view. FIG. 1 illustrates that the shape of the display area DA in a plan view is a rectangular shape. The display area DA may be disposed in a central area of the display panel DP. The non-display area NDA may be disposed around the display area DA along an edge (or periphery) of the display area DA. The non-display area NDA may be disposed to surround the display area DA.

The display area DA of the display panel DP may include a plurality of pixels PX. The pixel PX may be defined as a minimum light emitting unit capable of displaying white light.

Each of the plurality of pixels PX may include a plurality of emission areas EA1, EA2, and EA3 emitting light. It has been illustrated in one or more embodiments of the present disclosure that each of the plurality of pixels PX includes three emission areas EA1, EA2, and EA3, but the present disclosure is not limited thereto. For example, each of the plurality of pixels PX may include four emission areas.

Each of the plurality of emission areas EA1, EA2, and EA3 may include a light emitting element LE emitting first light. It has been illustrated that the light emitting element LE has a rectangular shape in a plan view, but the present disclosure is not limited thereto. For example, the light emitting element LE may have a polygonal, circular, elliptical, or irregular shape other than the rectangular shape.

Each of the first emission areas EA1 refers to an area emitting first light. Each of the first emission areas EA1 may emit the first light emitted from the light emitting element LE as it is. The first light may be light of a blue wavelength band. The blue wavelength band may be approximately 370 nm to 460 nm, but the present disclosure is not limited thereto.

Each of the second emission areas EA2 refers to an area emitting second light. Each of the second emission areas EA2 may convert the first light emitted from the light emitting element LE into the second light and emit the second light. The second light may be light of a green wavelength band. The green wavelength band may be approximately 480 nm to 560 nm, but the present disclosure is not limited thereto.

Each of the third emission areas EA3 refers to an area for emitting third light. Each of the third emission areas EA3 may convert the first light emitted from the light emitting element LE into the third light and emit the third light. The third light may be light of a red wavelength band. The red wavelength band may be approximately 600 nm to 750 nm, but one or more embodiments of the present disclosure are not limited thereto.

The first emission areas EA1, the second emission areas EA2, and the third emission areas EA3 may be alternately arranged along the first direction DR1. For example, the first emission areas EA1, the second emission areas EA2, and the third emission areas EA3 may be disposed in the order of the first emission area EA1, the second emission area EA2, and the third emission area EA3 along the first direction DR1.

The first emission areas EA1 may be arranged along the second direction DR2. The second emission areas EA2 may be arranged along the second direction DR2. The third emission areas EA3 may be arranged along the second direction DR2.

The plurality of emission areas EA1, EA2, and EA3 may be partitioned by a partition wall PW. The partition wall PW may be disposed to be around (e.g., surround) the light emitting element LE. The partition wall PW may be disposed to be spaced from the light emitting element LE. The partition wall PW may have a mesh shape, a net shape, or a lattice shape in a plan view.

Each of the plurality of emission areas EA1, EA2, and EA3 defined by the partition wall PW may have a rectangular shape in a plan view, but the present disclosure is not limited thereto. For example, each of the plurality of emission areas EA1, EA2, and EA3 defined by the partition wall PW may have a polygonal, circular, elliptical, or irregular shape other than the rectangular shape.

The non-display area NDA may include a first panel pad area PDA1 and a second panel pad area PDA3.

The first panel pad area PDA1 may be disposed in the non-display area NDA. The first panel pad area PDA1 may be disposed at an upper portion of the display panel DP in the second direction DR2. A first panel pad PD1 (see FIG. 2) to be described later may be disposed in the first panel pad area PDA1.

The second panel pad area PDA3 may be disposed in the non-display area NDA. In one or more embodiments, the second panel pad area PDA3 may be disposed below the semiconductor circuit substrate (CSUB) 110 (e.g., see, for example, FIG. 2) in the third direction DR3. A second panel pad may be disposed in the second panel pad area PDA3. In one or more embodiments, the second panel pad area PDA3 may be disposed at a lower portion of the display panel DP in the second direction DR2.

The second panel pad area PDA3 and the second panel pad may be substantially the same as or similar to the first panel pad area PDA1 and the first panel pad PD1, respectively, but the present disclosure is not limited thereto. In one or more embodiments, the second panel pad area PDA3 and the second panel pad may be omitted.

The non-display area NDA may include a common electrode connection area CPA around (e.g., surrounding) the display area DA.

The common electrode connection area CPA may be disposed in the non-display area NDA, and may be disposed between the first panel pad area PDA1 and the display area DA and between the second panel pad area PDA3 and the display area DA. The common electrode connection area CPA may be disposed on one side and the other side of the display area DA in the first direction DR1, and may be disposed on one side and the other side of the display area DA in the second direction DR2. The common electrode connection area CPA may include a plurality of connection electrodes CCP (see FIG. 3) to be connected to the semiconductor circuit substrate 110.

The common electrode connection area CPA may be disposed to be around (e.g., surround) at least a portion of the display area DA in a plan view. For example, as illustrated in FIG. 1, the common electrode connection area CPA may be disposed to completely surround the display area DA. However, the present disclosure is not limited thereto, and the common electrode connection area CPA may also be disposed on one side, both sides, or at least three sides of the display area DA.

Referring to FIG. 1, the display device 1 may further include a first circuit board CB1 and a second circuit board CB2.

The first circuit board CB1 and the second circuit board CB2 may be a flexible film such as a flexible printed circuit board (FPCB), a printed circuit board (PCB), a flexible printed circuit (FPC), or a chip on film (COF).

The first circuit board CB1 and the second circuit board CB2 may be disposed adjacent to edges of the display panel DP, respectively. The first circuit board CB1 and the second circuit board CB2 may be disposed with the display panel DP interposed therebetween in a plan view.

For example, in a plan view, the first circuit board CB1 may be disposed to face any one of both sides of the display panel DP extending in the first direction DR1, and the second circuit board CB2 may be disposed to face the other one of the both sides (e.g., that are extending in the first direction DR1) of the display panel DP. In this case, as illustrated in FIG. 1, the first circuit board CB1, the display panel DP, and the second circuit board CB2 may be sequentially arranged along the second direction DR2 in a plan view.

However, the present disclosure is not limited thereto, and any one of the first circuit board CB1 and the second circuit board CB2 may be disposed to face one side of the display panel DP extending in the first direction DR1 and the other of the first circuit board CB1 and the second circuit board CB2 may be disposed to face one side of the display panel DP extending in the second direction DR2. The second circuit board CB2 may also be omitted.

Figure 2:
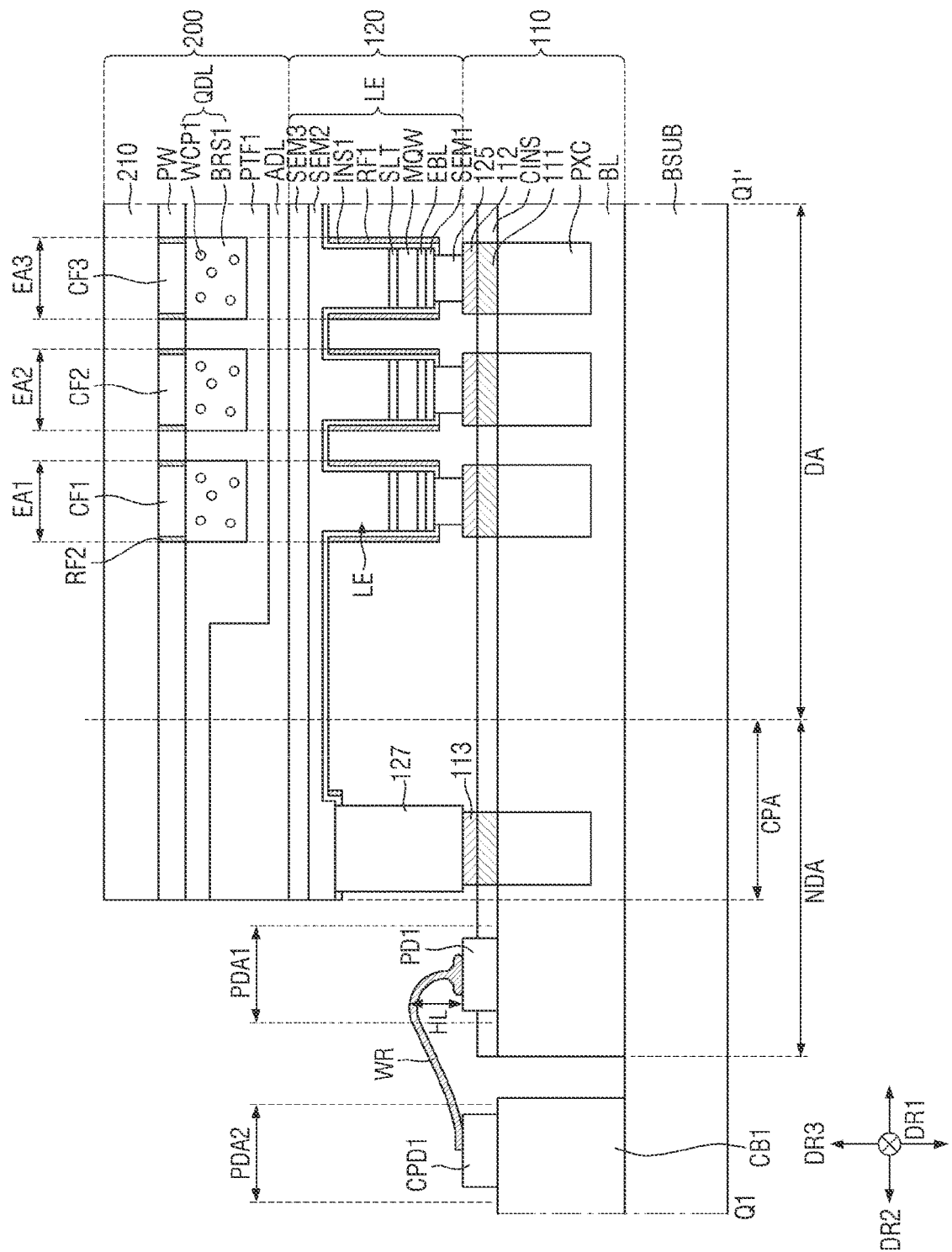
FIG. 2 is a cross-sectional view taken along the line Q1-Q1' of FIG. 1.

FIG. 2 is a cross-sectional view taken along the line Q1-Q1' of FIG. 1.

Referring to FIGS. 1 and 2, the display panel DP may include a semiconductor circuit substrate 110, a light emitting element layer 120, and a wavelength conversion substrate 200.

The semiconductor circuit substrate 110 may include a plurality of pixel circuit units PXC, pixel electrodes 111, contact electrodes 112, a common contact electrode 113, and a circuit insulating layer CINS. In one or more embodiments, the semiconductor circuit substrate 110 may include a buffer layer BL.

The semiconductor circuit substrate 110 is a silicon wafer substrate formed using a semiconductor process, and may be a first substrate. The plurality of pixel circuit units PXC of the semiconductor circuit substrate 110 may be formed using a semiconductor process.

The plurality of pixel circuit units PXC may be disposed in the display area DA and the non-display area NDA. Each of the plurality of pixel circuit units PXC may be connected to a corresponding pixel electrode 111. That is, the plurality of pixel circuit units PXC and a plurality of pixel electrodes 111 may be connected to each other so as to correspond to each other in a one-to-one manner. Each of the plurality of pixel circuit units PXC may overlap the light emitting element LE in the third direction DR3.

Each of the plurality of pixel circuit units PXC may include at least one transistor formed by a semiconductor process. In addition, each of the plurality of pixel circuit units PXC may further include at least one capacitor formed by a semiconductor process. The plurality of pixel circuit units PXC may include, for example, complementary metal oxide semiconductor (CMOS) circuits. Each of the plurality of pixel circuit units PXC may apply a pixel voltage or an anode voltage to the pixel electrode 111.

The circuit insulating layer CINS may be disposed on the plurality of pixel circuit units PXC. The circuit insulating layer CINS may protect the plurality of pixel circuit units PXC and may planarize a step between the plurality of pixel circuit units PXC. The circuit insulating layer CINS may expose each of the pixel electrodes 111 so that the pixel electrodes 111 may be connected to the light emitting element layer 120. The circuit insulating layer CINS may include an inorganic insulating material such as silicon oxide (SiOx), silicon nitride (SiNx), silicon oxynitride (SiOxNy), aluminum oxide (AlxOy), or aluminum nitride (AlN).

The plurality of pixel electrodes 111 may be disposed on corresponding pixel circuit units PXC. Each of the pixel electrodes 111 may be an exposed electrode exposed from the pixel circuit unit PXC. Each of the pixel electrodes 111 may be formed integrally with the pixel circuit unit PXC. Each of the pixel electrodes 111 may receive the pixel voltage or the anode voltage supplied from the pixel circuit unit PXC. The pixel electrodes 111 may include a metal material such as aluminum (Al).

The contact electrodes 112 may be disposed on corresponding pixel electrodes 111. The contact electrodes 112 may include a metal material for bonding the pixel electrodes 111 to the light emitting elements LE. For example, the contact electrodes 112 may include at least one of gold (Au), copper (Cu), aluminum (Al), and tin (Sn). Alternatively, the contact electrodes 112 may include a first layer including any one of gold (Au), copper (Cu), aluminum (Al), and tin (Sn) and a second layer including another of gold (Au), copper (Cu), aluminum (Al), and tin (Sn).

The common contact electrode 113 may be disposed in the common electrode connection area CPA of the non-display area NDA. The common contact electrode 113 may be disposed to be around (e.g., surround) the display area DA.

The common contact electrode 113 may include the same material as the contact electrodes 112. That is, the common contact electrode 113 and the contact electrodes 112 may be formed by the same process.

The semiconductor circuit substrate 110, the first circuit board CB1, and the second circuit board CB2 may be disposed on a base substrate BSUB. However, the present disclosure is not limited thereto, and the base substrate BSUB may be omitted or the base substrate BSUB may be replaced with the first circuit board CB1 or the second circuit board CB2.

The light emitting element layer 120 may include light emitting elements LE, first insulating layers INS1, connection electrodes 125, a common connection electrode 127, and first reflective layers RF1.

The light emitting element layer 120 may include the light emitting elements LE each corresponding to first emission areas EA1, second emission areas EA2, and third emission areas EA3 partitioned by a partition wall PW of the wavelength conversion substrate 200. The light emitting elements LE may be disposed in each of the first emission areas EA1, the second emission areas EA2, and the third emission areas EA3 so as to correspond to the first emission areas EA1, the second emission areas EA2, and the third emission areas EA3 in a one-to-one manner.

The light emitting element LE may be disposed on the contact electrode 112 in each of the first emission areas EA1, the second emission areas EA2, and the third emission areas EA3. The light emitting element LE may be a vertical light emitting diode element extending to be elongated in the third direction DR3. That is, a length of the light emitting element LE in the third direction DR3 may be greater than a length of the light emitting element LE in the horizontal direction. The length in the horizontal direction refers to a length in the first direction DR1 or a length in the second direction DR2. For example, the length of the light emitting element LE in the third direction DR3 may be approximately 1 to 5 μm.

The light emitting element LE includes a first semiconductor layer SEM1, an electron blocking layer EBL, an active layer MQW, a superlattice layer SLT, a second semiconductor layer SEM2, and a third semiconductor layer SEM3. The connection electrode 125, the first semiconductor layer SEM1, the electron blocking layer EBL, the active layer MQW, the superlattice layer SLT, the second semiconductor layer SEM2, and the third semiconductor layer SEM3 may be sequentially stacked in the third direction DR3. The light emitting element LE may be a micro light emitting diode device element.

The light emitting element LE may have a cylindrical shape, a disk shape, or a rod shape with a width greater than a height. However, the present disclosure is not limited thereto, and the light emitting element LE may have a shape such a rod shape, a wire shape, or a tube shape, or a polygonal prism shape such as a cube shape, a rectangular parallelepiped shape, or a hexagonal prism shape, or may have various shapes such as a shape extending in one direction and having outer surfaces partially inclined.

The connection electrode 125 may be disposed on the contact electrode 112. The connection electrode 125 may be attached to the contact electrode 112 to apply a light emitting signal to the light emitting element LE. The connection electrode 125 may be an ohmic connection electrode. However, the present disclosure is not limited thereto, and the connection electrode 125 may also be a Schottky connection electrode. The light emitting element LE may be connected to at least one connection electrode 125. It has been illustrated in FIG. 2 that the light emitting element LE is connected to one connection electrode 125, but the present disclosure is not limited thereto. In some cases, the light emitting element LE may be connected to a larger number of connection electrodes 125 or the connection electrode 125 may be omitted. A description of the light emitting element LE to be described later may be equally applied even though the number of the connection electrodes 125 is changed or the light emitting element LE is connected to a different structure.

The connection electrode 125 may decrease resistance between the light emitting element LE and the contact electrode 112 when the light emitting element LE is electrically connected to the contact electrode 112 in the display device 1 according to one or more embodiments. The connection electrode 125 may include a conductive metal. For example, the connection electrode 125 may include at least one of gold (Au), copper (Cu), tin (Sn), titanium (Ti), aluminum (Al), and silver (Ag). For example, the connection electrode 125 may include an alloy of gold and tin between which a ratio is 9:1, 8:2, or 7:3, or include an alloy (SAC305) of copper, silver, and tin.

The first semiconductor layer SEM1 may be disposed on the connection electrode 125. The first semiconductor layer SEM1 may be a p-type semiconductor, and may include a semiconductor material having a chemical formula: $Al_xGa_yIn_zN$. For example, the semiconductor material may be one or more of AlGaInN, GaN, AlGaN, InGaN, AlN, and InN doped with a p-type dopant. The first semiconductor layer SEM1 may be doped with a p-type dopant, which may be Mg, Zn, Ca, Sr, Ba, or the like. For example, the first semiconductor layer SEM1 may be made of p-GaN doped with p-type Mg. A thickness of the first semiconductor layer SEM1 may be in the range of 30 nm to 200 nm, but is not limited thereto.

The electron blocking layer EBL may be disposed on the first semiconductor layer SEM1. The electron blocking layer EBL may be a layer for suppressing or preventing excessively many electrons from flowing into the active layer MQW. For example, the electron blocking layer EBL may be made of p-AlGaN doped with p-type Mg. A thickness of the electron blocking layer EBL may be in the range of 10 nm to 50 nm, but is not limited thereto. In addition, the electron blocking layer EBL may be omitted.

The active layer MQW may be disposed on the electron blocking layer EBL. The active layer MQW may emit light by a combination of electron-hole pairs according to an electric signal applied through the first semiconductor layer SEM1 and the second semiconductor layer SEM2. The active layer MQW may emit first light having a central wavelength band in the range of 450 nm to 495 nm, that is, light of a blue wavelength band.

The active layer MQW may include a material having a single or multiple quantum well structure. When the active layer MQW includes a material having a multiple quantum well structure, a plurality of well layers and barrier layers may be alternately stacked. In this case, the well layer may be made of InGaN, and the barrier layer may be made of GaN or AlGaN, but the present disclosure is not limited thereto. A thickness of the well layer may be approximately 1 to 4 nm, and a thickness of the barrier layer may be 3 nm to 10 nm.

Alternatively, the active layer MQW may have a structure in which semiconductor materials having large band gap energy and semiconductor materials having small band gap energy are alternately stacked, and may include other Group III to Group V semiconductor materials depending on a wavelength band of emitted light. The light emitted by the active layer MQW is not limited to the first light, and in some cases, the active layer MQW may emit second light (light of a green wavelength band) or third light (light of a red wavelength band).

The superlattice layer SLT may be disposed on the active layer MQW. The superlattice layer SLT may be a layer for relaxing stress between the second semiconductor layer SEM2 and the active layer MQW. For example, the superlattice layer SLT may be made of InGaN or GaN. A thickness of the superlattice layer SLT may be approximately 50 to 200 nm. In one or more embodiments, the superlattice layer SLT may be omitted.

The second semiconductor layer SEM2 may be disposed on the superlattice layer SLT. The second semiconductor layer SEM2 may be an n-type semiconductor. The second semiconductor layer SEM2 may include a semiconductor material having a chemical formula: $Al_xGa_yIn_zN$. For example, the semiconductor material may be one or more of AlGaInN, GaN, AlGaN, InGaN, AlN, and InN doped with an n-type dopant. The second semiconductor layer SEM2 may be doped with an n-type dopant, which may be Si, Ge, Sn, or the like. For example, the second semiconductor layer SEM2 may be made of n-GaN doped with n-type Si. A thickness of the second semiconductor layer SEM2 may be in the range of 2 μm to 4 μm, but is not limited thereto.

As illustrated in FIG. 2, the second semiconductor layer SEM2 may be a common layer commonly connected to and disposed on a plurality of light emitting elements LE. At least portions of the second semiconductor layer SEM2 in the third direction DR3 may be disposed in the respective light emitting elements LE to be formed in a patterned shape, and the remaining portion of the second semiconductor layer SME2 may continuously extend in the first direction DR1 to be commonly disposed on the plurality of light emitting elements LE. The second semiconductor layer SEM2 may allow a common voltage applied through the common contact electrode 113 to be commonly applied to the plurality of light emitting elements LE.

A third semiconductor layer SEM3 to be described later may be disposed as a common layer together with the second semiconductor layer SEM2, but because the third semiconductor layer SEM3 does not have conductivity, a signal may be applied through the second semiconductor layer SEM2 having conductivity. The second semiconductor layer SEM2 and the third semiconductor layer SEM3 may be disposed to extend from the display area DA to the non-display area NDA. In the second semiconductor layer SEM2, a thickness of an area overlapping the first semiconductor layer SEM1 of the light emitting element LE may be greater than a thickness of an area that does not overlap the first semiconductor layer SEM1 in the third direction DR3.

The third semiconductor layer SEM3 may be disposed on the second semiconductor layer SEM2. The third semiconductor layer SEM3 may be an undoped semiconductor. The third semiconductor layer SEM3 may include a material that is the same as that of the second semiconductor layer SEM2, but is not doped with an n-type or p-type dopant. In one or more embodiments, the third semiconductor layer SEM3 may be made of at least one of undoped InAlGaN, GaN, AlGaN, InGaN, AlN, and InN, but is not limited thereto.

The third semiconductor layer SEM3 may be a common layer commonly connected to the plurality of light emitting elements LE. The third semiconductor layer SEM3 may continuously extend in the first direction DR1 to be commonly disposed on the plurality of light emitting elements LE. The third semiconductor layer SEM3 may act as a base layer of the plurality of light emitting elements LE. In a process of manufacturing a light emitting element layer 120 to be described later, layers constituting the light emitting elements LE are manufactured on the third semiconductor layer SEM3, such that the third semiconductor layer SEM3 acts as a base layer. A thickness of the third semiconductor layer SEM3 may be smaller than a thickness of a first semiconductor area of the second semiconductor layer SEM2 (e.g., a thickness of an area of the second semiconductor layer SEM2 overlapping the first semiconductor layer SEM1 of the light emitting element LE) and may be greater than a thickness of a second semiconductor area of the second semiconductor layer SEM2 (e.g., a thickness of an area of the second semiconductor layer SEM2 that does not overlap the first semiconductor layer SEM1 of the light emitting element LE).

In one or more embodiments, the common connection electrode 127 may be disposed in the common electrode connection area CPA of the non-display area NDA. The common connection electrode 127 may be disposed on one surface of the second semiconductor layer SEM2. For example, the common connection electrode 127 may be disposed between one surface of the second semiconductor layer SEM2 and the common contact electrode 113. The common connection electrode 127 may serve to transfer a common voltage signal of the light emitting elements LE from the common contact electrode 113. The common connection electrode 127 may be made of the same material as the connection electrodes 125. The common connection electrode 127 may have a great thickness (e.g., may be relatively thick) in the third direction DR3 in order to be connected to the common contact electrode 113. The thickness of the common connection electrode 127 may be greater than a thickness of the connection electrode 125 in the third direction DR3.

The above-described light emitting elements LE may receive the pixel voltages or the anode voltages of the pixel electrodes 111 supplied through the connection electrodes 125 and receive the common voltage supplied through the second semiconductor layer SEM2. The light emitting element LE may emit light with a desired luminance (e.g., a predetermined luminance) according to a voltage difference between the pixel voltage and the common voltage.

The first insulating layers INS1 may be disposed on side surfaces of the common connection electrode 127, side surfaces and another surface (e.g., an upper surface) of the second semiconductor layer SEM2, side surfaces of each of the light emitting elements LE, and side surfaces of the connection electrodes 125. The first insulating layers INS1 may insulate the common connection electrode 127, the second semiconductor layer SEM2, the light emitting elements LE, and the connection electrodes 125 from other layers.

As illustrated in FIG. 2, the first insulating layers INS1 may be disposed to be around (e.g., surround) the light emitting elements LE. The first insulating layer INS1 may include an inorganic insulating material such as silicon oxide (SiOx), silicon nitride (SiNx), silicon oxynitride (SiOxNy), aluminum oxide (AlxOy), or aluminum nitride (AlN). A thickness of the first insulating layer INS1 may be approximately 0.1 μm, but is not limited thereto.

The first reflective layers RF1 serve to reflect light traveling toward side surfaces rather than in an upward direction (e.g., an image display direction of the display panel DP or the third direction DR3), in the light emitted from the light emitting element LE. The first reflective layers RF1 may be disposed in the display area DA and the non-display area NDA. The first reflective layers RF1 may be disposed to overlap the first emission area EA1, the second emission area EA2, and the third emission area EA3 in the display area DA.

The first reflective layers RF1 may be disposed on the side surfaces of the common connection electrode 127, the side surfaces of the connection electrodes 125, and the side surfaces of each of the light emitting elements LE. The first reflective layers RF1 may be disposed directly on the first insulating layers INS1 and may be disposed on side surfaces of the first insulating layers INS1. The first reflective layers RF1 may be disposed to be spaced from the common connection electrode 127, the connection electrodes 125, and the light emitting elements LE by the first insulating layers INS1.

As illustrated in FIG. 2, the first reflective layers RF1 may be disposed to be around (e.g., surround) the light emitting elements LE in the display area DA. Each of the light emitting elements LE may be surrounded by the first insulating layers INS1, and the first insulating layers INS1 may be surrounded by the first reflective layers RF1. The first reflective layers RF1 may be disposed to be spaced from each other, and may be disposed to be spaced from first reflective layers RF1 of adjacent light emitting elements LE. That is, the first reflective layers RF1 may be disposed to be spaced from each other in the first direction DR1 and the second direction DR2. The first reflective layer RF1 and the first insulating layer INS1 may have a rectangular closed loop shape in a plan view, but the present disclosure is not limited thereto, and the first reflective layer RF1 and the first insulating layer INS1 may have various shapes according to a shape of the light emitting element LE in a plan view.

The first reflective layer RF1 may include a metal material having high reflectivity, such as aluminum (Al). A thickness of the first reflective layer RF1 may be approximately 0.1 μm, but is not limited thereto.

In one or more embodiments, the wavelength conversion substrate 200 may be disposed on the light emitting element layer 120. The wavelength conversion substrate 200 may include an upper substrate 210, a partition wall PW, color filters CF1, CF2, and CF3, second reflective layers RF2, wavelength conversion layers QDL, and a first protective layer PTF1.

The upper substrate 210 may be a second substrate facing (e.g., opposing or opposite) the first substrate, which is the semiconductor circuit substrate 110. The upper substrate 210 may be a base substrate disposed at the uppermost portion of the wavelength conversion substrate 200 and supporting the wavelength conversion substrate 200. The upper substrate 210 may face the semiconductor circuit substrate 110. The upper substrate 210 may include a transparent substrate such as a sapphire ($Al_2O_3$) substrate or a glass substrate. However, the present disclosure is not limited thereto, and the upper substrate 210 may also be formed as a conductive substrate made of GaN, SiC, ZnO, Si, GaP, GaAs, and the like. Hereinafter, a case where the upper substrate 210 is a sapphire ($Al_2O_3$) substrate will be described by way of example. A thickness of the upper substrate 210 is not particularly limited, but the upper substrate 210 may have a thickness in the range of 400 μm to 1500 μm as an example.

The partition wall PW may be disposed on one surface of the upper substrate 210. As illustrated in FIGS. 1 and 2, the partition wall PW may partition and define the first emission area EA1, the second emission area EA2, and the third emission area EA3. The partition wall PW may be disposed to extend in the first direction DR1 and the second direction DR2, and may be formed in a lattice pattern throughout the display area DA. In addition, the partition wall PW may extend from the display area DA to the non-display area NDA and may be disposed throughout the non-display area NDA.

The partition wall PW may include silicon (Si). For example, the partition wall PW may include a silicon single crystal layer. The partition walls PW including silicon may be etched to have a high aspect ratio using a deep reactive ion etching (DRIE) method. As a result, the partition walls PW having the high aspect ratio may be easily manufactured. Accordingly, the partition wall PW may form the emission areas EA1, EA2, and EA3 having ultrahigh resolution, and the display device 1 having ultra-high resolution may thus be manufactured.

A plurality of color filters CF1, CF2, and CF3 may be disposed on the upper substrate 210 in a plurality of openings defined by the partition wall PW. The plurality of color filters CF1, CF2, and CF3 may include a first color filter CF1, a second color filter CF2, and a third color filter CF3.

The first color filter CF1 may be disposed to overlap the first emission area EA1. The first color filter CF1 may transmit the first light emitted from the light emitting element LE and absorb or block the second light and the third light. For example, the first color filter CF1 may transmit light of a blue wavelength band and absorb or block light of other wavelength bands such as green and red wavelength bands.

The second color filter CF2 may be disposed to overlap the second emission area EA2. The second color filter CF2 may transmit the second light and absorb or block the first light and the third light. For example, the second color filter CF2 may transmit light of a green wavelength band and absorb or block light of other wavelength bands such as blue and red wavelength bands.

The third color filter CF3 may be disposed to overlap the third emission area EA3. The third color filter CF3 may transmit the third light and absorb or block the first light and the second light. For example, the third color filter CF3 may transmit light of a red wavelength band and absorb or block light of other wavelength bands such as blue and green wavelength bands.

Upper surfaces of the plurality of color filters CF1, CF2, and CF3 may coincide with an upper surface of the partition wall PW. However, the present disclosure is not limited thereto, and an upper surface of at least one of the color filters CF1, CF2, and CF3 may be higher than upper surfaces of the other color filters or higher than the upper surface of the partition wall PW.

The second reflective layers RF2 may be disposed in the plurality of openings defined by the partition wall PW. The second reflective layers RF2 may be disposed on side surfaces of the partition wall PW. In one or more embodiments, second reflective layers RF2 may be disposed on side surfaces of each of the plurality of color filters CF1, CF2, and CF3. The second reflective layers RF2 serve to reflect light traveling toward left and right side surfaces rather than in an upward direction (e.g., the image display direction of the display panel DP or the third direction DR3), in the light emitted from the light emitting element LE. The second reflective layers RF2 may be disposed in the display area DA, and may be disposed to overlap the first emission area EA1, the second emission area EA2, and the third emission area EA3.

As illustrated in FIG. 2, the second reflective layers RF2 may be disposed to be around (e.g., surround) the plurality of color filters CF1, CF2, and CF3 in the display area DA. The second reflective layers RF2 may be disposed to be spaced from each other, and may be disposed to be spaced from second reflective layers RF2 of adjacent color filters. That is, the second reflective layers RF2 may be disposed to be spaced from each other in the first direction DR1 and the second direction DR2. The second reflective layer RF2 may have a rectangular closed loop shape in a plan view, but the present disclosure is not limited thereto, and the second reflective layer RF2 may have various shapes according to a shape of the openings of the partition wall PW in a plan view.

The second reflective layer RF2 may include the same material as the above-described first reflective layer RF1, and may include, for example, a metal material having high reflectivity, such as aluminum (Al). A thickness of the second reflective layer RF2 may be approximately 0.1 μm, but is not limited thereto.

The wavelength conversion layers QDL may be disposed on the plurality of color filters CF1, CF2, and CF3. The wavelength conversion layers QDL may convert or shift a peak wavelength of incident light to light having other specific peak wavelengths and emit the light having other specific peak wavelengths. The wavelength conversion layer QDL may convert a portion of the first light of blue emitted from the light emitting element LE into fourth light of yellow. The wavelength conversion layer QDL may mix the first light with the fourth light to emit fifth light of white. The fifth light may be converted into the first light through the first color filter CF1, may be converted into the second light through the second color filter CF2, and may be converted into the third light through the third color filter CF3.

The wavelength conversion layers QDL may be disposed to overlap each of the first color filter CF1, the second color filter CF2, and the third color filter CF3, in the third direction DR3 and may be disposed to be spaced from each other. The wavelength conversion layers QDL may be formed as island patterns spaced from each other. The wavelength conversion layer QDL may correspond to the plurality of openings disposed in the partition wall PW in a one-to-one manner, and may overlap the plurality of openings. In one or more embodiments, the wavelength conversion layers QDL may completely overlap the plurality of openings.

The wavelength conversion layer QDL may include a first base resin BRS1 and first wavelength conversion particles WCP1. The first base resin BRS1 may include a light-transmitting organic material. For example, the first base resin BRS1 may include an epoxy-based resin, an acrylic-based resin, a cardo-based resin, or an imide-based resin.

The first wavelength conversion particle WCP1 may convert the first light incident from the light emitting element LE into the fourth light. For example, the first wavelength conversion particle WCP1 may convert light of a blue wavelength band into light of a yellow wavelength band. The first wavelength conversion particle WCP1 may be a quantum dot (QD), a quantum rod, a fluorescent material, or a phosphorescent material. For example, the quantum dot may be particulate matter emitting a specific color while electrons are transitioning from a conduction band to a valence band.

The quantum dot may be a semiconductor nanocrystal material. The quantum dot may have a specific bandgap according to its composition and size to absorb light and then emit light having a unique wavelength. Examples of semiconductor nanocrystals of the quantum dot may include Group IV nanocrystal, Group II-VI compound nanocrystals, Group III-V compound nanocrystals, Group IV-VI compound nanocrystals, or combinations thereof.

A Group II-VI compound may be selected from the group consisting of a binary compound selected from the group consisting of CdSe, CdTe, ZnS, ZnSe, ZnTe, ZnO, HgS, HgSe, HgTe, MgSe, MgS, and mixtures thereof; a ternary compound selected from the group consisting of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

A Group III-V compound may be selected from the group consisting of a binary compound selected from the group consisting of GaN, GaP, GaAs, GaSb, AlN, AlP, AlAs, AlSb, InN, InP, InAs, InSb, and mixtures thereof; a ternary compound selected from the group consisting of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and mixtures thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPS, and mixtures thereof.

A Group IV-VI compound may be selected from the group consisting of a binary compound selected from the group consisting of SnS, SnSe, SnTe, PbS, PbSe, PbTe, and mixtures thereof; a ternary compound selected from the group consisting of SnSeS, SnSeTe, SnSTe, PbSeS, PbSeTe, PbSTe, SnPbS, SnPbSe, SnPbTe, and mixtures thereof; and a quaternary compound selected from the group consisting of SnPbSSe, SnPbSeTe, SnPbSTe, and mixtures thereof. A Group IV element may be selected from the group consisting of Si, Ge, and mixtures thereof. A Group IV compound may be a binary compound selected from the group consisting of SiC, SiGe, and mixtures thereof.

In this case, the binary compound, the ternary compound, or the quaternary compound may be present in a particle at a uniform concentration or may be present in the same particle in a state of partially different concentration distributions. In addition, the quantum dot may have a core/shell structure in which the shell surrounds the core. An interface between a core and a shell may have a concentration gradient so that a concentration of element present in the shell decreases toward the center.

In one or more embodiments, the quantum dot may have a core-shell structure including a core including the above-described nanocrystals and a shell surrounding the core. The shell of the quantum dot may serve as a protective layer for maintaining semiconductor characteristics by preventing chemical modification of the core and/or serve as a charging layer for imparting electrophoretic characteristics to the quantum dot. The shell may be a single layer or a multilayer. Examples of the shell of the quantum dot may include a metal or non-metal oxide, a semiconductor compound, or a combination thereof.

Examples of the metal or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, or a ternary compound such as $MgAl_2O_4$, $CoFe_2O_4$, $NiFe_2O_4$, or $CoMn_2O_4$, but the present disclosure is not limited thereto.

In addition, examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, but the present disclosure is not limited thereto.

The wavelength conversion layer QDL may further include a scatterer for scattering the light of the light emitting element LE in a random direction. The scatterer may have a refractive index different from that of the first base resin BRS1 and form an optical interface with the first base resin BRS1. For example, the scatterer may be a light scattering particle. The scatterer is not particularly limited as long as it is a material capable of scattering at least a portion of transmitted light, but may be, for example, a metal oxide particle or an organic particle. Examples of a metal oxide of the metal oxide particle may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), or the like, and examples of a material of the organic particle may include an acrylic resin, a urethane resin or the like. The scatterer may scatter light in a random direction regardless of an incident direction of the incident light without substantially converting a wavelength of the light.

As a thickness of the wavelength conversion layer QDL in the third direction DR3 increases, a content of the first wavelength conversion particles WCP1 included in the wavelength conversion layer QDL increases, and light conversion efficiency of the wavelength conversion layer QDL may thus increase. Therefore, the thickness of the wavelength conversion layer QDL is set (e.g., suitably set) in consideration of the light conversion efficiency of the wavelength conversion layer QDL.

In the above-described wavelength conversion substrate 200, a portion of the first light emitted from the light emitting element LE may be converted into the fourth light by the wavelength conversion layer QDL. The wavelength conversion layer QDL may mix the first light with the fourth light to emit the fifth light of the white. Only the first light in the fifth light, which is white light emitted from the wavelength conversion layer QDL, may be transmitted through the first color filter CF1, only the second light in the fifth light may be transmitted through the second color filter CF2, and only the third light in the fifth light may be transmitted through the third color filter CF3. Accordingly, the light emitted from the wavelength conversion substrate 200 may be blue, red, and green light of the first light, the second light, and the third light, through which a full color may be realized.

The first protective layer PTF1 may be disposed on the partition wall PW and the wavelength conversion layers QDL and may cover the partition wall PW and the wavelength conversion layers QDL. The first protective layer PTF1 may be disposed throughout the display area DA and the non-display area NDA. The first protective layer PTF1 may protect the wavelength conversion layers QDL in the display area DA and planarize a step formed due to the wavelength conversion layers QDL. One surface of the first protective layer PTF1 adjacent to the light emitting element LE may be flat.

The first protective layer PTF1 may be disposed between the light emitting element LE and the wavelength conversion layer QDL, and may prevent the first wavelength conversion particles WCP1 of the wavelength conversion layer QDL from being damaged due to heat generation of the light emitting element LE. A thickness of the first protective layer PTF1 may be approximately 1 to 10 μm at the thickest portion. The first protective layer PTF1 may include an organic insulating material, for example, an epoxy-based resin, an acrylic-based resin, a cardo-based resin, or an imide-based resin.

In one or more embodiments, an adhesive layer ADL may be disposed between the light emitting element layer 120 and the wavelength conversion substrate 200. The adhesive layer ADL adheres the light emitting element layer 120 on which the semiconductor circuit substrate 110 is formed and the wavelength conversion substrate 200 to each other, and may include a transparent material. The adhesive layer ADL may include, for example, an acryl-based material, a silicon-based material, a urethane-based material, or the like, and may include a UV curable or thermally curable material.

Figure 3:
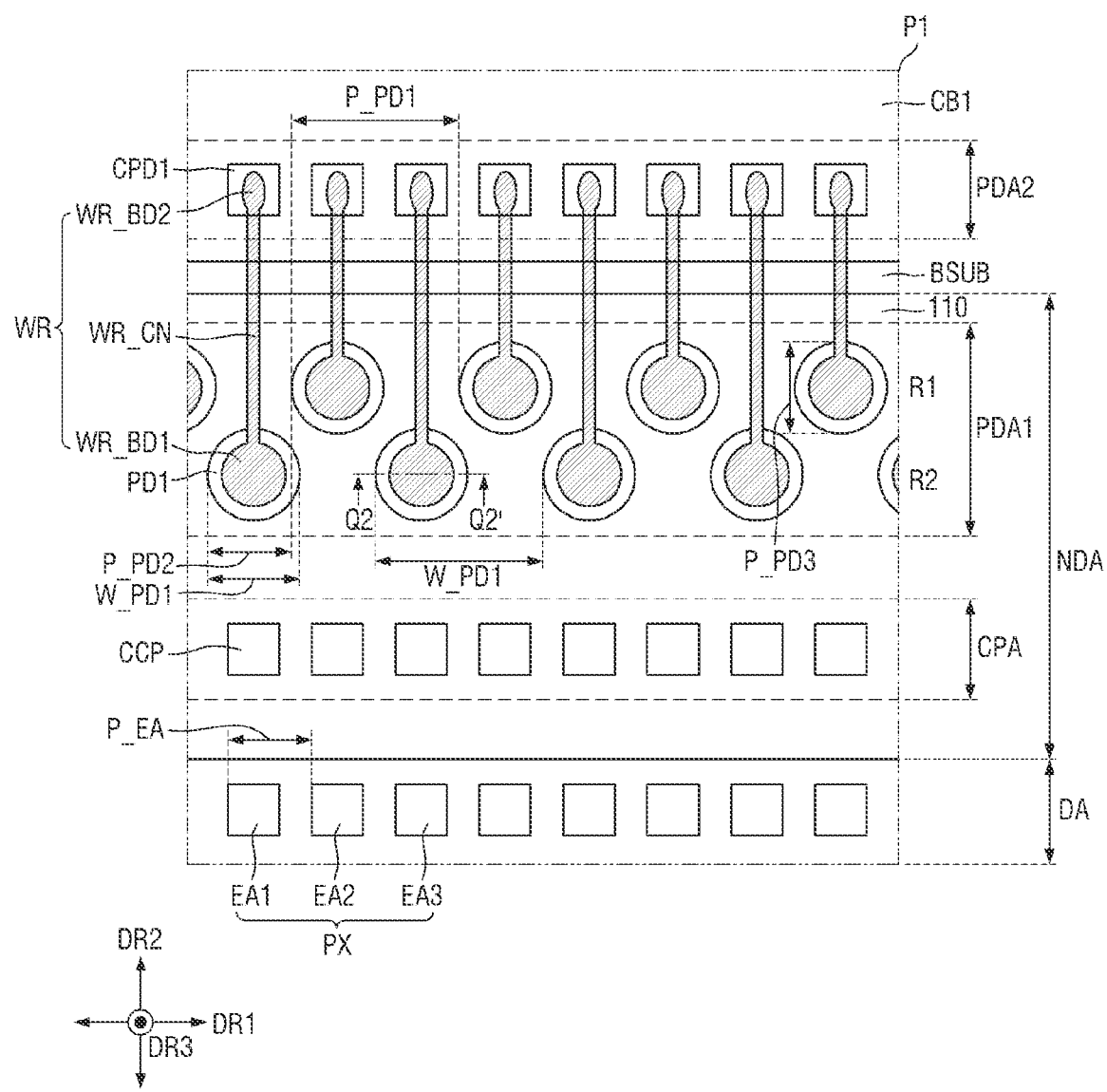
FIG. 3 is an enlarged plan view of a portion 'P1' of FIG. 1.
Figure 4:
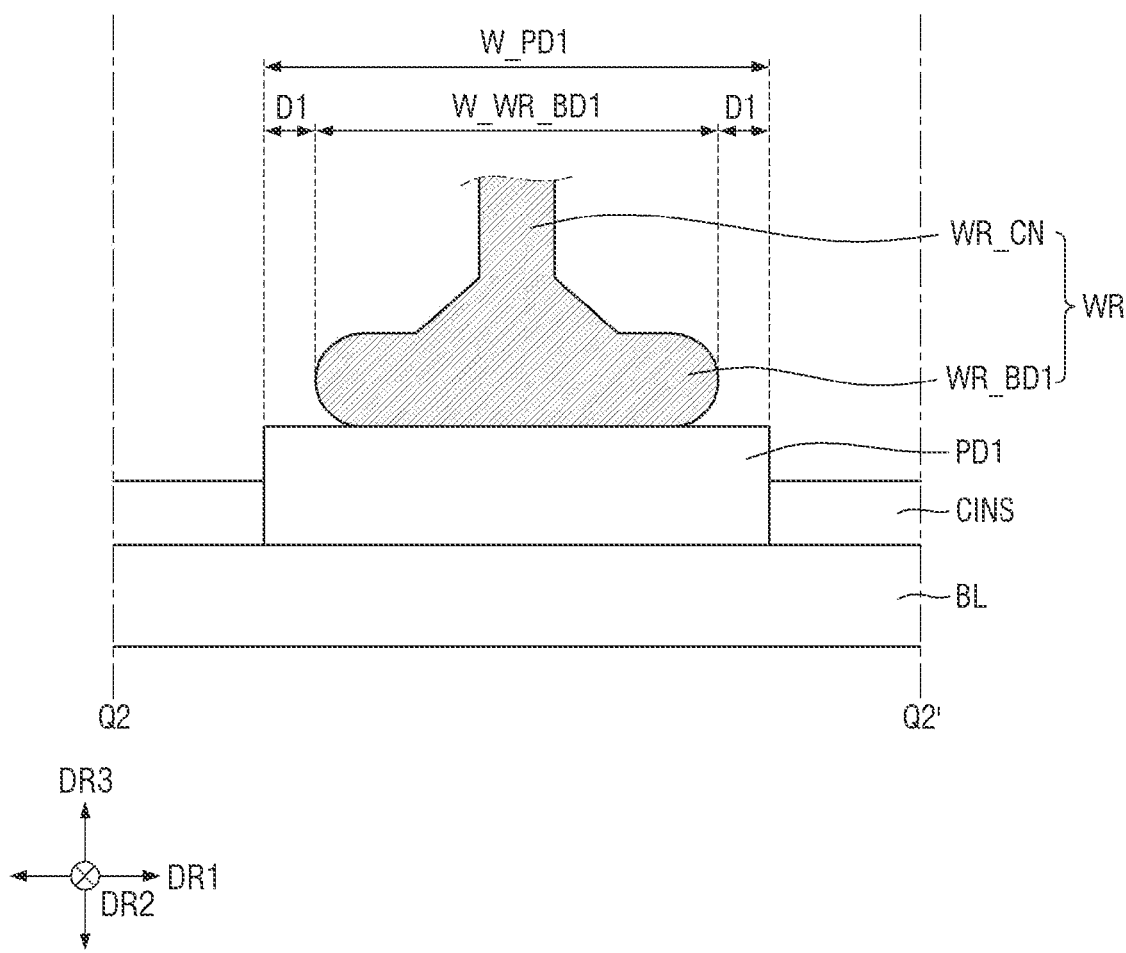
FIG. 4 is a cross-sectional view taken along the line Q2-Q2' of FIG. 3.

FIG. 3 is an enlarged plan view of a portion P1' of FIG. 1. FIG. 4 is a cross-sectional view taken along the line Q2-Q2' of FIG. 3.

Referring to FIGS. 1-3, as described above, the first panel pad area PDA1 may include a plurality of first panel pads PD1.

The plurality of first panel pads PD1 may be disposed in the first panel pad area PDA1. The plurality of first panel pads PD1 may be disposed on the semiconductor circuit substrate 110.

The plurality of first panel pads PD1 may be arranged to form two or more rows extending in the first direction DR1, in a plan view. For example, as illustrated in FIG. 3, the plurality of first panel pads PD1 may be arranged to form a first row R1 and a second row R2 extending in the first direction DR1. However, the present disclosure is not limited thereto, and the plurality of first panel pads PD1 may be arranged to form three or more rows.

The first panel pads PD1 in the first row R1 may be disposed more adjacent to the edges of the display panel DP, edges of the semiconductor circuit substrate 110, a first pad area PDA2, and first pads CPD1 than the first panel pads PD1 in the second row R2 are. The first panel pads PD1 in the second row R2 may be disposed more adjacent to the display area DA or the common electrode connection area CPA of the display panel DP than the first panel pads PD1 in the first row R1 are.

The plurality of first panel pads PD1 may be arranged to form a zigzag pattern in a plan view. In detail, as illustrated in FIG. 3, the first panel pads PD1 in the first row R1 may be arranged at a first pitch P_PD1 along the first direction DR1, and the first panel pads PD1 in the second row R2 may also be arranged at a first pitch P_PD1 along the first direction DR1. In this case, the first panel pads PD1 in the first row R1 and the first panel pad PD1 in the second row R2 that is most adjacent to the first panel pad PD1 of the first row R1 may be arranged at a second pitch P_PD2 in the first direction DR1 that is smaller than the first pitch P_PD1.

The first pitch P_PD1 may be approximately twice the second pitch P_PD2. The second pitch P_PD2 may be substantially the same as a reference pitch P_EA at which the plurality of emission area EA1, EA2, and EA3 are arranged. However, the present disclosure is not limited thereto, and the second pitch P_PD2 may be greater or smaller than the reference pitch P_EA.

The first pitch P_PD1 may be equal to or smaller than twice the width W_PD1 of the first panel pad PD1 or the width W_WR_BD1 of a first bonding portion WR_BD1. For example, when the width W_PD1 of the first panel pad PD1 or the width W_WR_BD1 of the first bonding portion WR_BD1 is approximately 60 µm to 70 µm, the first pitch P_PD1 may be approximately 120 µm to 140 µm or less. However, the present disclosure is not limited thereto, and the first pitch P_PD1 may be greater than twice the width W_PD1 of the first panel pad PD1.

The second pitch P_PD2 may be smaller than the width W_PD1 of the first panel pad PD1. In this case, a gap between the first panel pads PD1 in the first row R1 in the first direction DR1 may be smaller than the width W_PD1 of the first panel pad PD1. The width W_PD1 of the first panel pad PD1 may be a width in the first direction DR1 or the second direction DR2. The width W_PD1 of the first panel pad PD1 may be a maximum width or an average width in the first direction DR1. For example, the second pitch P_PD2 may be approximately 60 µm to 70 µm or less. However, the present disclosure is not limited thereto, and the second pitch P_PD2 may be substantially the same as the width W_PD1 of the first panel pad PD1 or may be greater than the width W_PD1 of the first panel pad PD1.

The first panel pads PD1 in the first row R1 and the first panel pads PD1 in the second row R2 may be arranged at a third pitch P_PD3 in the second direction DR2. The third pitch P_PD3 may be substantially the same as the second pitch P_PD2, but is not limited thereto. The third pitch P_PD3 may be greater or smaller than the second pitch P_PD2.

The first panel pads PD1 in the first row R1 may be positioned in a diagonal direction crossing the first direction DR1 and the second direction DR2 with respect to the first panel pads PD1 in the second row R2 most adjacent to the first panel pads PD1 in the first row R1.

The first panel pads PD1 in the first row R1 may be disposed to be exposed in the second direction DR2 between the first panel pads PD1 in the second row R2. The first panel pads PD1 in the first row R1 may only partially overlap the first panel pads PD1 in the second row R2 in the second direction DR2. However, the present disclosure is not limited thereto, and the first panel pads PD1 in the first row R1 may not overlap the first panel pads PD1 in the second row R2 in the second direction DR2 according to a relationship between the second pitch P_PD2 and the width W_PD1 of the first panel pad PD1.

The first panel pad PD1 may overlap at least one of the first emission area EA1, the second emission area EA2, and the third emission area EA3 in the second direction DR2. The first panel pad PD1 may be aligned with at least one of the first emission area EA1, the second emission area EA2, and the third emission area EA3 in the second direction DR2. The first panel pad PD1 may overlap the connection electrode CCP in the second direction DR2.

As the plurality of first panel pads PD1 are arranged in a zigzag shape, the plurality of first panel pads PD1 may be arranged at a fine pitch along the first direction DR1, but each first panel pad PD1 may be spaced from a neighboring first panel pad PD1 and a wire WR connected to the neighboring first panel pad PD1 as much as possible, such that a connection failure that may occur between the neighboring first panel pads PD1 and the corresponding wires WR may be prevented.

Each of the plurality of first panel pads PD1 may have a shape for being spaced from the neighboring first panel pad PD1 and the wire WR connected to the neighboring first panel pad PD1 as much as possible, in a plan view. Therefore, a connection failure of the first panel pad PD1 or the wire WR may be prevented. For example, as illustrated in FIG. 3, each of the plurality of first panel pads PD1 may have a substantially circular shape in a plan view. In this case, the plurality of first panel pads PD1 may be arranged at a finer pitch than in a case in which each of the plurality of first panel pads PD1 has a rectangular or square shape in a plan view. However, the present disclosure is not limited thereto, and each of the plurality of first panel pads PD1 may have various shapes such as a rectangular shape, a square shape, an elliptical shape, and a rhombic shape in a plan view.

Referring further to FIG. 2, the first panel pad PD1 may be made of the same material as at least one of the pixel electrode 111, the contact electrode 112, and the common contact electrode 113. The first panel pad PD1 may be formed concurrently (or simultaneously) with at least one of the pixel electrode 111, the contact electrode 112, and the common contact electrode 113. The first panel pad PD1 may be made of a conductive material different from that of a wire WR to be described later, but is not limited thereto.

Referring to FIG. 3, the first pad area PDA2 may include a plurality of first pads CPD1 connected to the respective ones of the plurality of first panel pads PD1.

As illustrated in FIG. 3, the plurality of first pads CPD1 may be arranged to form a row extending in the first direction DR1. The plurality of first pads CPD1 may be arranged at a pitch that is substantially the same as the second pitch P_PD2 or the reference pitch P_EA. However, the present disclosure is not limited thereto, and the plurality of first pads CPD1 may be arranged to form a plurality of rows in a plan view or may be arranged to form a zigzag pattern in a manner that is the same as or similar to a manner in which the plurality of first panel pads PD1 are arranged.

The first pad CPD1 may overlap at least one of the first panel pad PD1 and the connection electrode CCP in the second direction DR2. However, the present disclosure is not limited thereto, and each of the plurality of first pads CPD1 may be disposed so as not to overlap the first panel pad PD1 in the second direction DR2.

For example, as illustrated in FIG. 3, each of the plurality of first pads CPD1 may have a substantially square shape in a plan view, but is not limited thereto. Each of the plurality of first pads CPD1 may have various shapes such as a rectangular shape, a circular shape, an elliptical shape, and a rhombic shape in a plan view.

The display device 1 may include a wire WR electrically connecting the first pad CPD1 and the first panel pad PD1 to each other.

One end of the wire WR may be connected to the first panel pad PD1, and the other end of the wire WR may be connected to the first pad CPD1. The wire WR may include a conductive metal material. For example, the wire WR may include at least one of gold, copper, aluminum, tin, and alloys thereof, but is not limited thereto.

The wire WR may be formed by, for example, a wire WR bonding process of bonding a thin metal wire to a pad such as the first pad CPD1 or the first panel pad PD1 to electrically connect the first pad CPD1 and the first panel pad PD1 to each other.

The wire bonding process may include a thermocompression bonding method of applying a voltage or heat to a tip of a capillary that supplies a metal wire to make the wire into a ball shape and pressing the wire made into the ball shape (i.e., the ball-shaped wire metal) with the capillary to attach the wire to a heated pad, an ultrasonic method of applying an ultrasonic wave to a capillary for pressing a metal wire to adhere the metal wire to a pad, and a composite method (e.g., thermal ultrasonic method or thermocompression ultrasonic method) of using both of heat and an ultrasound wave.

The wire WR may include a first bonding portion WR_BD1 bonded to the first panel pad PD1, a second bonding portion WR_BD2 bonded to the first pad CPD1, and a connection portion WR_CN connecting the first bonding portion WR_BD1 and the second bonding portion WR_BD2 to each other.

As illustrated in FIGS. 2 and 3, the first bonding portion WR_BD1 may have a substantially circular shape in a plan view, and the second bonding portion WR_BD2 may have a substantially elliptical shape in a plan view. A size of the first bonding portion WR_BD1 may be greater than that of the second bonding portion WR_BD2, but sizes of the first and second bonding portions WR_BD1 and WR_BD2 and shapes of the first and second bonding portions WR_BD1 and WR_BD2 in a plan view are not limited thereto.

One end of the connection portion WR_CN may be connected to the first bonding portion WR_BD1, and the other end of the connection portion WR_CN may be connected to the second bonding portion WR_BD2. For example, a diameter of the connection portion WR_CN may be approximately 24 μm to 26 μm, but is not limited thereto.

As illustrated in FIG. 2, the connection portion WR_CN may be disposed in a loop shape having a suitable looping height HL (e.g., a predetermined looping height HL) on the basis of a surface of the first panel pad PD1 (or the first pad CPD1) on a cross section. The looping height HL may refer to a maximum height or refer to an average height.

Referring to FIGS. 3 and 4, the first bonding portion WR_BD1 may be disposed on the first panel pad PD1. As described above, the first bonding portion WR_BD1 may be formed by compressing a ball formed by a thermocompression bonding process or a composite process onto the first panel pad PD1. Accordingly, the first bonding portion WR_BD1 may have an approximately flat elliptical shape on a cross section.

The width W_WR_BD1 of the first bonding portion WR_BD1 may be smaller than the width W_PD1 of the first panel pad PD1. The width W_WR_BD1 of the first bonding portion WR_BD1 may be a maximum width (or an average width) in the first direction DR1 or the second direction DR2. However, the present disclosure is not limited thereto, and the width W_WR_BD1 of the first bonding portion WR_BD1 may be the same as the width W_PD1 of the first panel pad PD1 or may be greater than the width W_PD1 of the first panel pad PD1.

As illustrated in FIG. 4, when the width W_WR_BD1 of the first bonding portion WR_BD1 is smaller than the width W_PD1 of the first panel pad PD1, an edge of the first bonding portion WR_BD1 may be spaced from an edge of the first panel pad PD1 by a first distance D1, on a cross-section. For example, the first distance D1 may be greater than approximately 0 μm and be 5 μm or less, but is not limited thereto.

The width W_PD1 of the first panel pad PD1 may be determined by the width W_WR_BD1 of the first bonding portion WR_BD1. In detail, the width W_PD1 of the first panel pad PD1 may be determined by a resolution of the display device 1, a pitch of pads (e.g., the first panel pads PD1 or the first pads CPD1) according to the resolution, and a minimum width of the first bonding portion WR_BD1 that may be formed by a wire bonding process. For example, the width W_WR_BD1 of the first bonding portion WR_BD1 may be approximately 60 μm, and the width W_PD1 of the first panel pad PD1 may be approximately 60 μm to 65 μm. In this case, the second pitch P_PD2 may be equal to or smaller than the width W_WR_BD1 of the first bonding portion WR_BD1 or the width W_PD1 of the first panel pad PD1, and the resolution of the display device 1 may be approximately 2000 ppi or more, for example, approximately 5000 ppi to 6000 ppi. However, the width W_WR_BD1 of the first bonding portion WR_BD1, the width W_PD1 of the first panel pad PD1, the resolution, and the like, are not limited to the above examples, and may vary depending on a design of the display device 1.

Referring to FIGS. 1-3, similar to the first panel pad area PDA1 and the first pad area PDA2, a plurality of second panel pads and a plurality of second pads may be disposed in the second panel pad area PDA3 and a second pad area PDA4, respectively. The second panel pad, the second pad, and a connection manner between the second panel pad and the second pad may be substantially the same as or similar to the first panel pad PD1, the first pad CPD1, and the connection manner of the first panel pad PD1 and the first pad CPD1.

Figure 5:
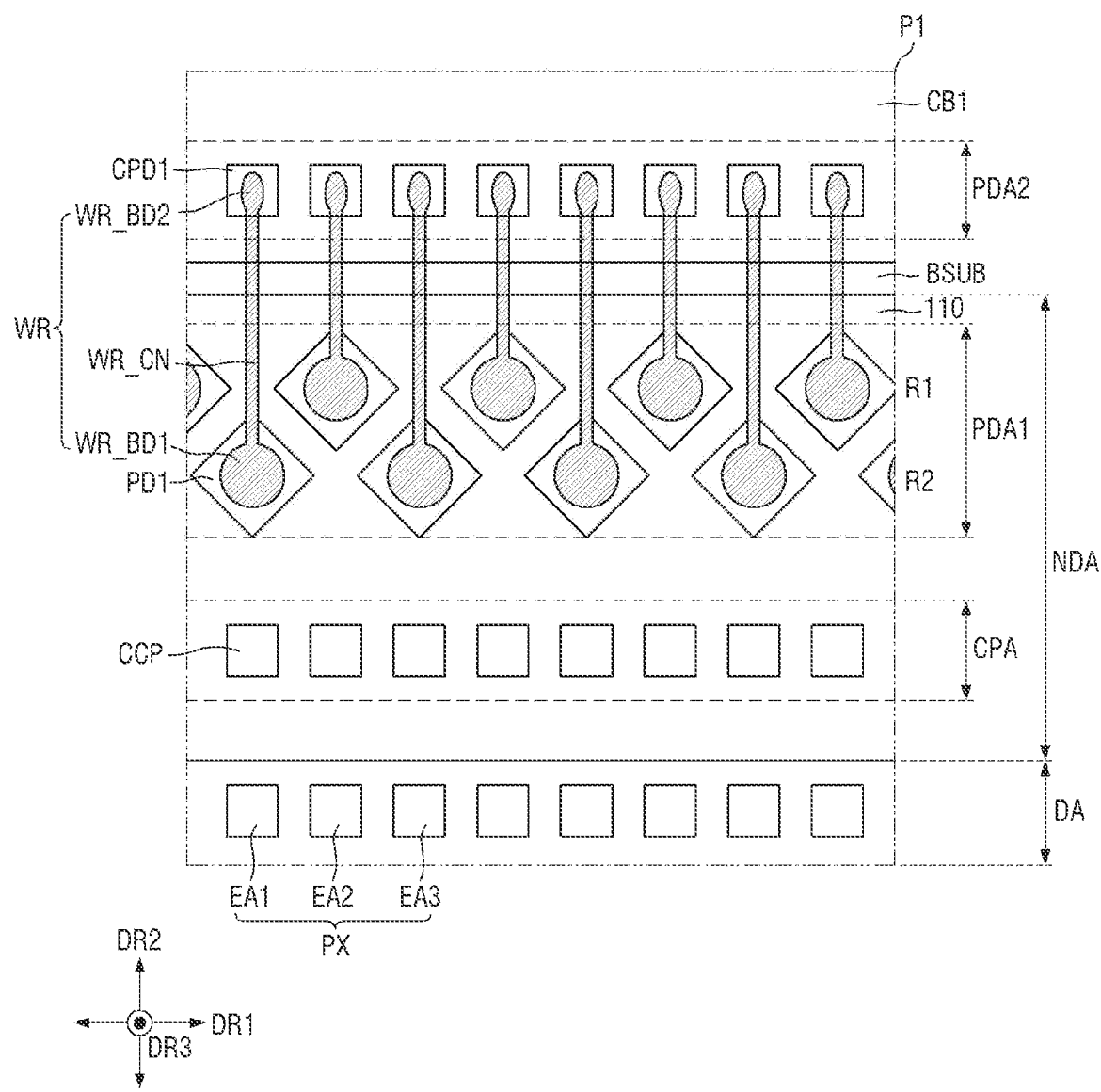
FIG. 5 is a plan view of a first panel pad area and a first pad area according to one or more embodiments of the present disclosure.

FIG. 5 is a plan view of a first panel pad area and a first pad area according to one or more embodiments.

Referring to FIG. 5, the plurality of first panel pads PD1 may be arranged in a zigzag pattern in a plan view. The pitch at which the plurality of first panel pads PD1 are arranged is as described above.

As illustrated in FIG. 5, unlike the embodiment of FIG. 3, each of the first panel pads PD1 may have a substantially rhombic (or diamond) shape in a plan view. In this case, as compared with a case in which the first panel pad PD1 has a substantially circular shape (e.g., see, FIG. 3) in a plan view, a pitch between the plurality of first panel pads PD1 may be maintained, but an area of the first panel pad PD1 may increase, such that an adhesion margin to the first bonding portion WR_BD1 in the first direction DR1 or the second direction DR2 or an adhesion area of the first bonding portion WR_BD1 may increase. Accordingly, a connection failure between neighboring wires WR may be prevented, and an adhesive force of the wire WR to the first panel pad PD1 may be improved.

The embodiment of FIG. 5 is substantially the same as or similar to the embodiment of FIGS. 1-4 with the exception of a shape of the first panel pad PD1 in a plan view, and an overlapping description will thus be omitted below.

Figure 6:
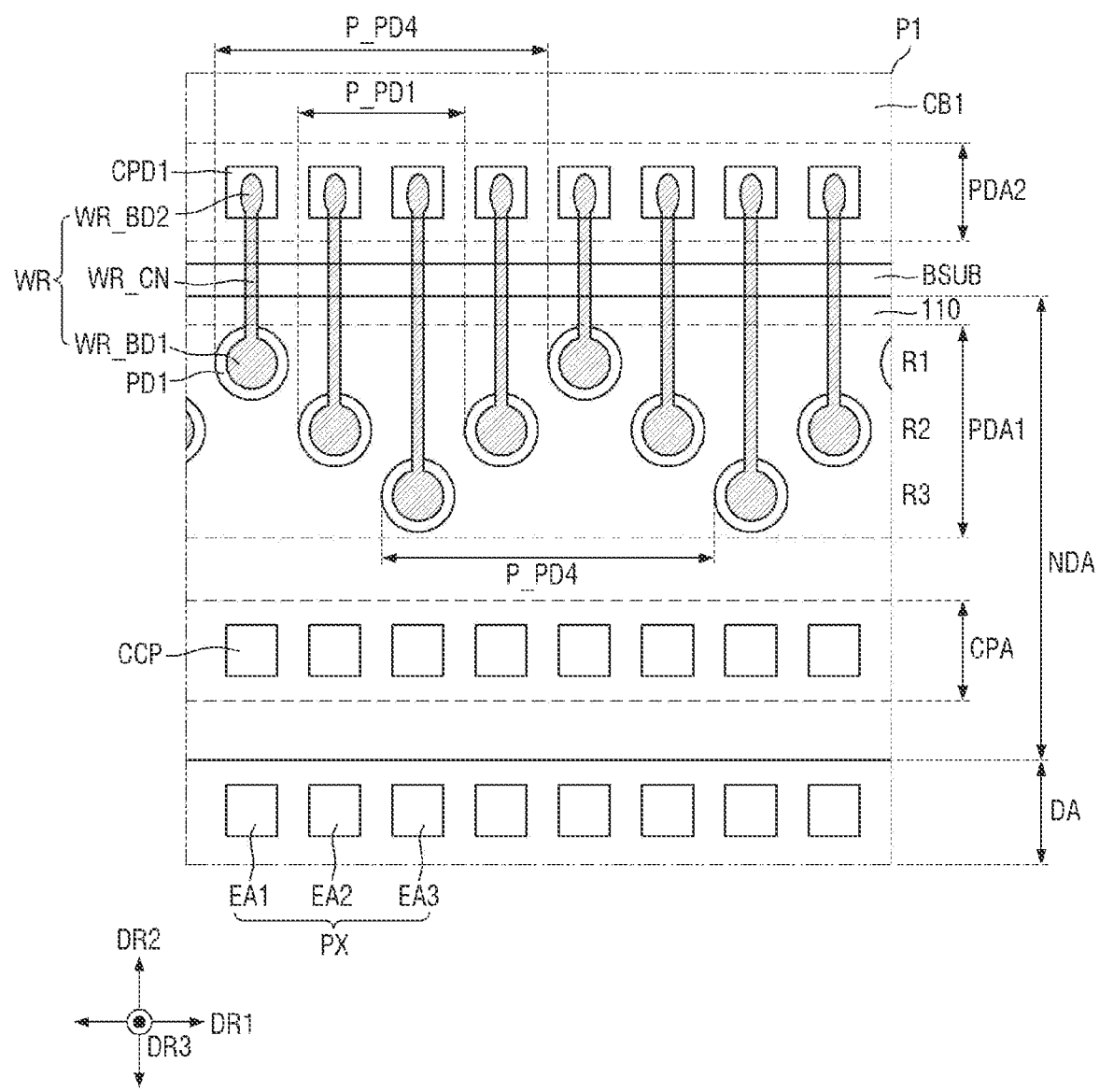
FIG. 6 is a plan view of a first panel pad area and a first pad area according to one or more embodiments of the present disclosure.

FIG. 6 is a plan view of a first panel pad area and a first pad area according to one or more embodiments.

Referring to FIG. 6, the plurality of first panel pads PD1 may be arranged to form three rows extending in the first direction DR1.

A first row R1 may be disposed adjacent to an edge of the display panel DP, a third row R3 may be disposed adjacent to the display area DA of the display panel DP, and a second row R2 may be disposed between the first row R1 and the third row R3. The first panel pads PD1 in the first row R1, the first panel pads PD1 in the second row R2, and the first panel pads PD1 in the third row R3 may be respectively arranged along the first direction DR1.

The first panel pads PD1 in at least one of the first row R1, the second row R2, and the third row R3 may be arranged to have a pitch different from that of the first panel pads PD1 in the other rows.

For example, as illustrated in FIG. 6, the first panel pads PD1 in the second row R2 may be arranged at a first pitch P_PD1, but the first panel pads PD1 in the first row R1 and the first panel pads PD1 in the third row R3 may be arranged at the same fourth pitch P_PD4. The fourth pitch P_PD4 may be approximately four times the first pitch P_PD1 or the reference pitch P_EA. The first panel pads PD1 in the first row R1, the first panel pads PD1 in the second row R2, and first panel pads PD1 in the third row R3 may be each arranged at the same pitch as the first pitch P_PD1 along the second direction DR2, but are not limited thereto.

The first panel pads PD1 in the first row R1 and the first panel pads PD1 in the third row R3 may be exposed in the second direction DR2 between the first panel pads PD1 in the second row R2. For example, as shown in FIG. 6, the first panel pads PD1 of the first row R1 and the first panel pads PD1 of the third row R3 may be alternately arranged along the first direction DR1 between the first panel pads PD1 of the second row R2. The first panel pad PD1 and the other first panel pad PD1 most adjacent to the first panel pad PD1 may not overlap each other or may only partially overlap each other in the first direction DR1.

However, the present disclosure is not limited thereto, and the first panel pads PD1 in the first row R1, the second row R2, and the third row R3 may be arranged at the same pitch, and the first panel pads PD1 in the first row R1, the second row R2, and the third row R3 may not overlap each other or may only partially overlap each other in the second direction DR2.

The embodiment of FIG. 6 is substantially the same as or similar to the embodiment of FIGS. 1-4 with the exception of an arrangement of the plurality of first panel pads PD1, and an overlapping description will thus be omitted below.

Figure 7:
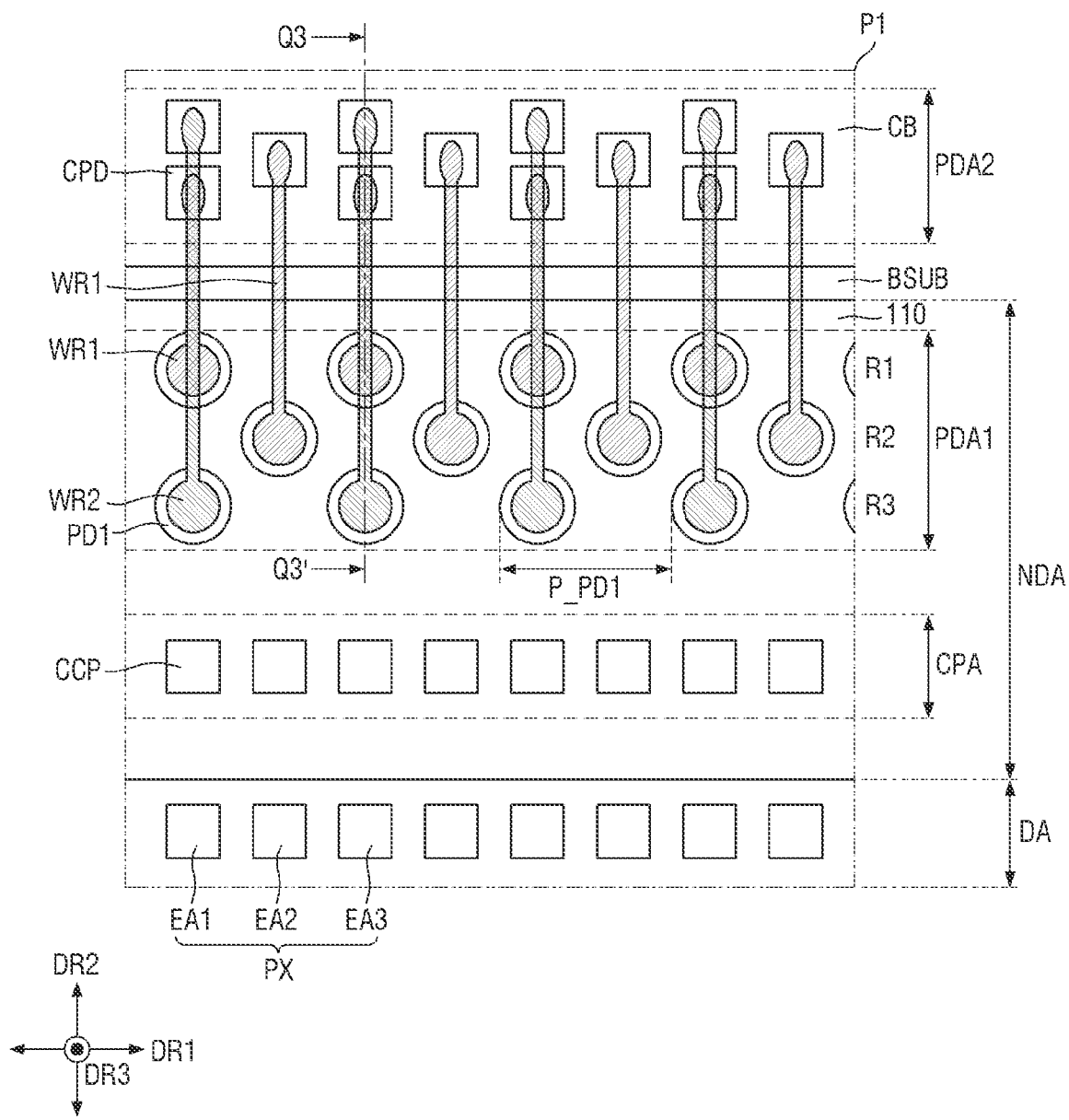
FIG. 7 is a plan view of a first panel pad area and a first pad area according to one or more embodiments of the present disclosure.
Figure 8:
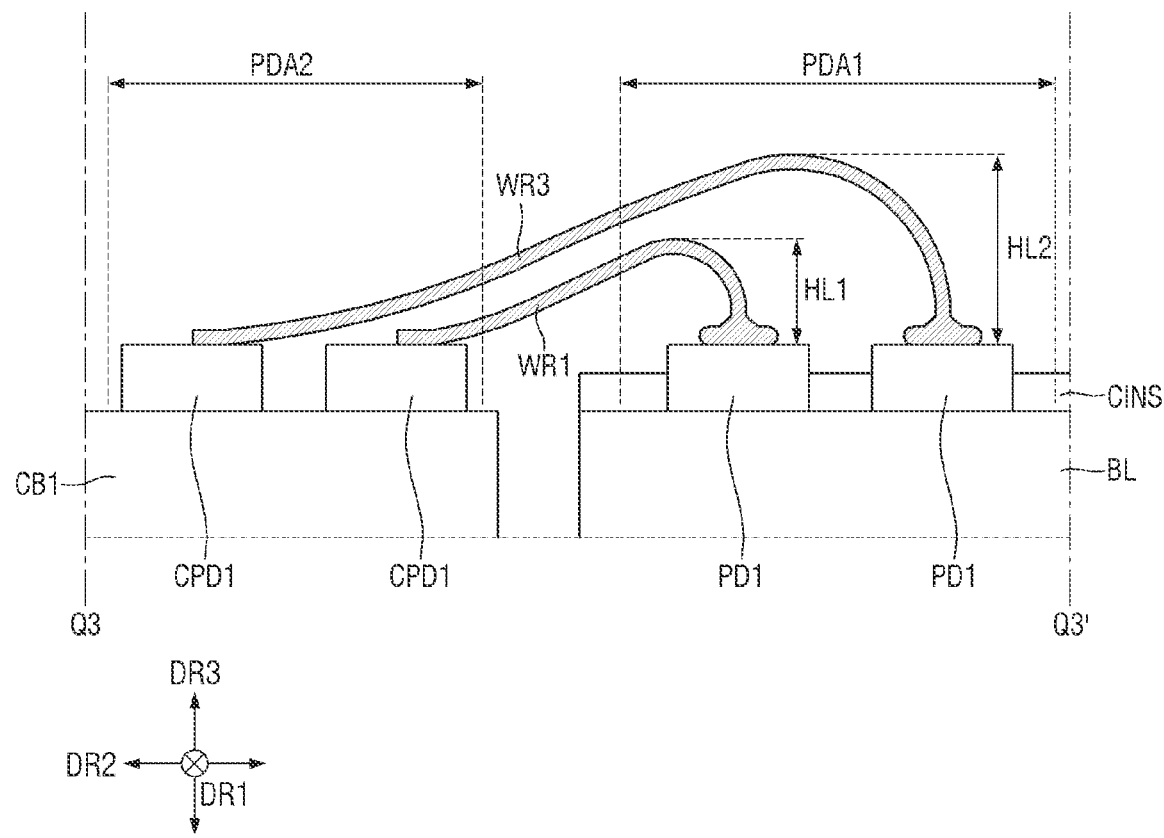
FIG. 8 is a cross-sectional view taken along the line Q3-Q3' of FIG. 7.

FIG. 7 is a plan view of a first panel pad area and a first pad area according to one or more embodiments. FIG. 8 is a cross-sectional view taken along the line Q3-Q3' of FIG. 7.

Referring to FIG. 7, the plurality of first panel pads PD1 may be arranged to form three rows.

Similar to the embodiment of FIG. 6, a first row R1 may be disposed adjacent to an edge of the display panel DP, a third row R3 may be disposed adjacent to the display area DA of the display panel DP, and a second row R2 may be disposed between the first row R1 and the third row R3. The first panel pads PD1 in the first row R1, the first panel pads PD1 in the second row R2, and the first panel pads PD1 in the third row R3 may be respectively arranged along the first direction DR1.

The first panel pads PD1 in the first row R1, the first panel pads PD1 in the second row R2, and the first panel pads PD1 in the third row R3 may be arranged at the same first pitch P_PD1 in the first direction DR1. The first pitch P_PD1 may be the same as or smaller than the reference pitch P_EA.

As illustrated in FIG. 7, the first panel pads PD1 in the first row R1 and the first panel pads PD1 in the third row R3 may be arranged to overlap each other in the second direction DR2, but the first panel pads PD1 in the second row R2 may be disposed to be exposed in the second direction DR2 between the first panel pads PD1 in the first row R1 and/or the first panel pads PD1 in the third row R3. That is, the first panel pads PD1 in the second row R2 may be disposed so as not to overlap or to partially overlap the first panel pads PD1 in the first row R1 or the first panel pads PD1 in the third row R3 in the second direction DR2.

The plurality of first pads CPD1 may be arranged in a manner that is substantially the same as or similar to a manner in which the plurality of first panel pads PD1 are arranged, but are not limited thereto.

Referring to FIGS. 7 and 8, on a cross-section, the first panel pad PD1 in the first row R1 may be connected to the first pad CPD1 most adjacent to an edge of the first circuit board CB1 by a first wire WR1. The first panel pad PD1 in the second row R2 may be connected to the first pad CPD1 that is spaced from the edge of the first circuit board CB1, further than the first pad CPD1 connected to the first wire WR1, by a second wire WR2. The first panel pad PD1 in the third row R3 may be connected to the first pad CPD1 spaced from the edge of the first circuit board CB1 further than the first pad CPD1 connected to the second wire WR2 by a third wire WR3.

In a plan view, the first wire WR1 and the third wire WR3 may at least partially overlap each other in the third direction DR3. On a cross section, the first wire WR1 may have a first looping height HL1, and the third wire WR3 may have a second looping height HL2 greater than the first looping height HL1. Accordingly, a short circuit between the first wire WR1 and the third wire WR3 may be prevented. The second wire WR2 may have a looping height equal to or greater than the first looping height HL1 and smaller than the second looping height HL2, but is not limited thereto.

The embodiment of FIG. 7 is substantially the same as or similar to the embodiment of FIGS. 1-4 with the exception of the plurality of first panel pads PD1, the plurality of first pads CPD1, and the wire WR, and an overlapping description will thus be omitted below.

Figure 9:
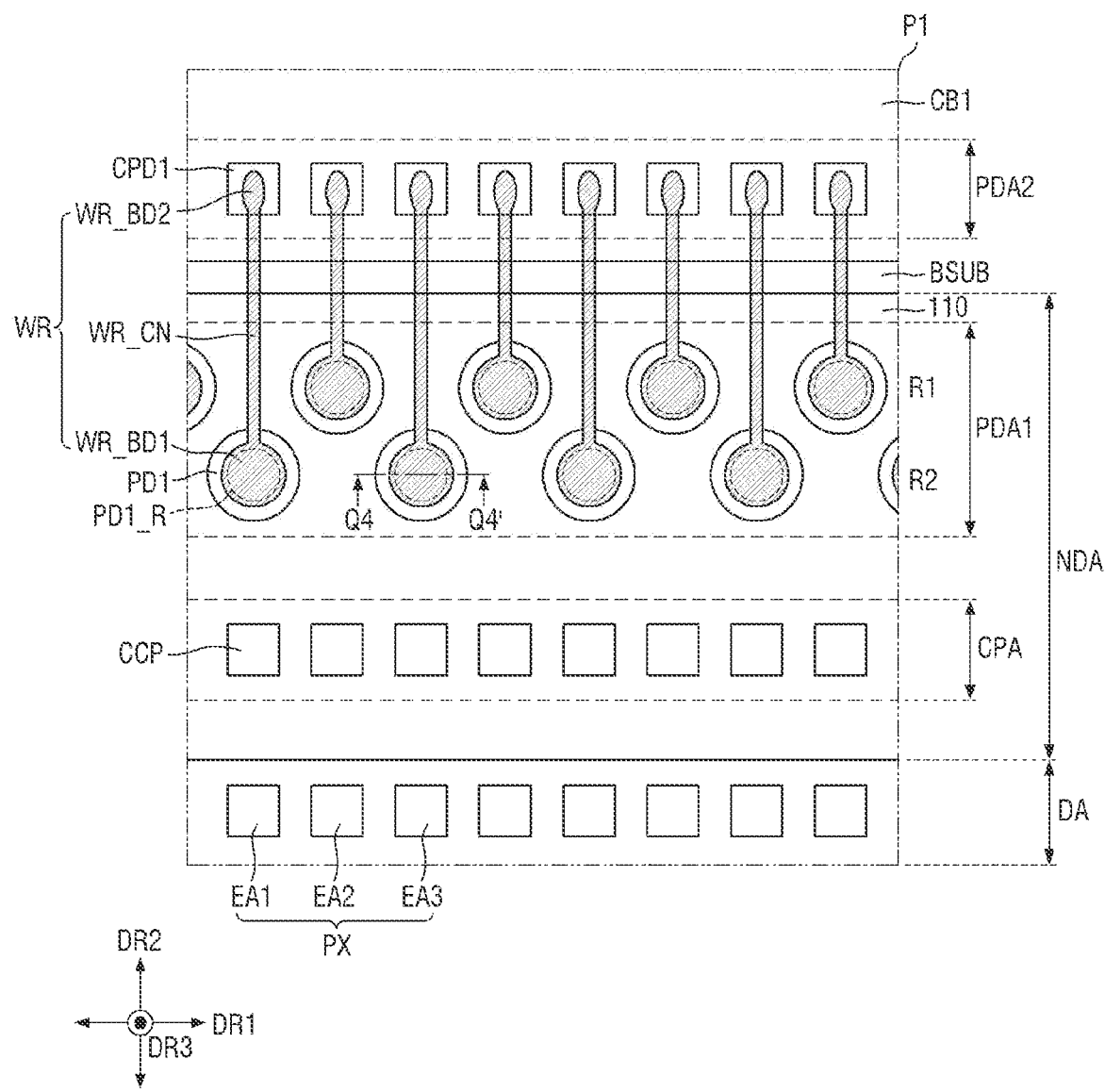
FIG. 9 is a plan view of a first panel pad area and a first pad area according to one or more embodiments of the present disclosure.
Figure 10:
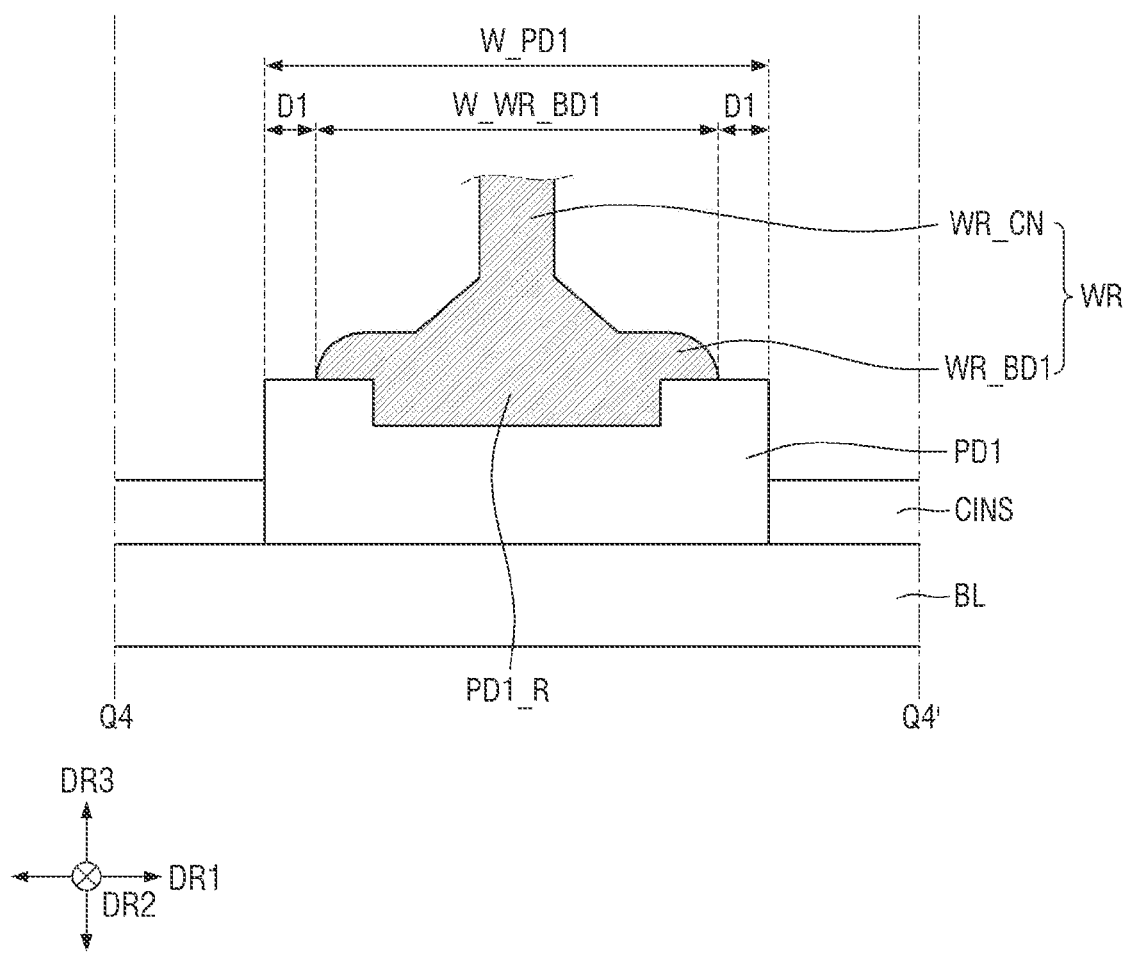
FIG. 10 is a cross-sectional view taken along the line Q4-Q4' of FIG. 9.

FIG. 9 is a plan view of a first panel pad area and a first pad area according to one or more embodiments. FIG. 10 is a cross-sectional view taken along the line Q4-Q4' of FIG. 9.

Referring to FIGS. 9 and 10, each of the plurality of first panel pads PD1 may include a recessed portion PD1_R.

As illustrated in FIGS. 9 and 10, the recessed portion PD1_R may be formed at a middle portion of the first panel pad PD1 and may overlap the first bonding portion WR_BD1 in the third direction DR3. The recessed portion PD1_R may be recessed from an upper portion of the first panel pad PD1 to which the first bonding portion WR_BD1 is attached toward a lower portion of the first panel pad PD1. Accordingly, the first panel pad PD1 may have a shape, for example, like a well of which a middle portion of an upper portion is concave.

The first bonding portion WR_BD1 may be attached to the upper portion of the first panel pad PD1 so as to fill the recessed portion PD1_R. As illustrated in FIG. 10, an attachment area of the first bonding portion WR_BD1 may be increased by the recessed portion PD1_R, such that an adhesive force of the wire WR may be improved.

Figure 11:
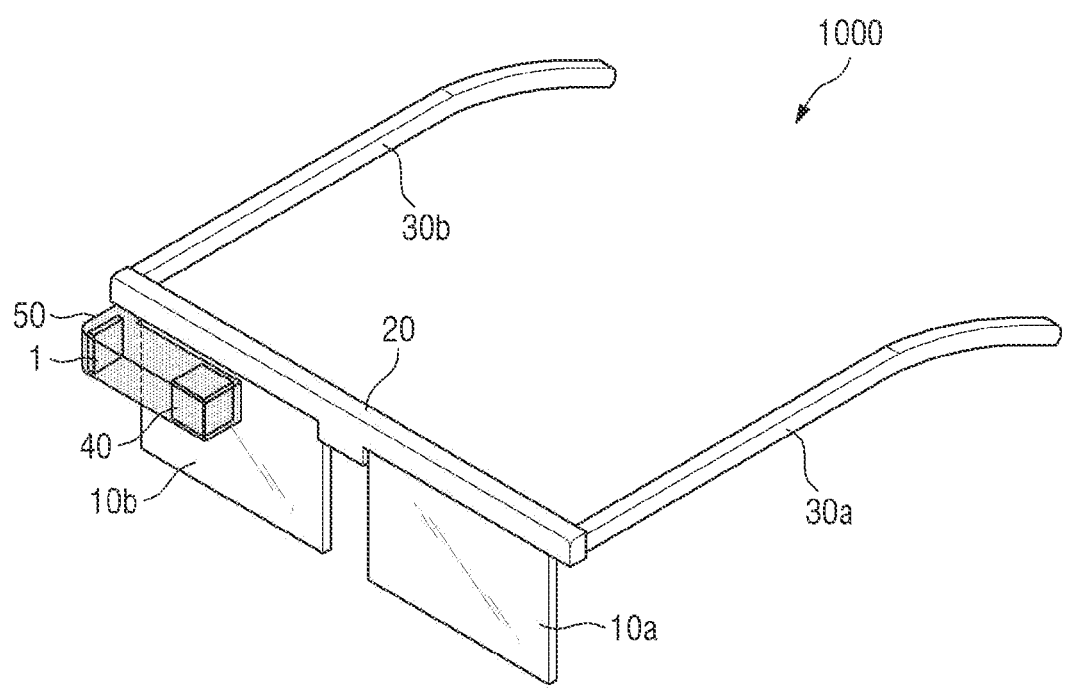
FIG. 11 is an illustrative view illustrating a virtual reality device including a display device according to one or more embodiments of the present disclosure.

FIG. 11 is an illustrative view illustrating a virtual reality device including a display device according to one or more embodiments.

FIG. 11 illustrates a virtual reality device 1000 to which the display device 1 according to one or more embodiments is applied.

Referring to FIG. 11, the virtual reality device 1000 according to one or more embodiments may be a glasses-type device. The virtual reality device 1000 according to one or more embodiments may include the display device 1, a left eye lens 10a, a right eye lens 10b, a support frame 20, eyeglass frames legs 30a and 30b, a reflective member 40, and a display device accommodating unit 50.

The virtual reality device 1000 including the eyeglass frame legs 30a and 30b has been illustrated in FIG. 11, but the virtual reality device 1000 according to one or more embodiments may also be applied to a head mounted display including a head mounted band that may be mounted on a user's head instead of the eyeglass frame legs 30a and 30b. That is, the virtual reality device 1000 according to one or more embodiments is not limited to that illustrated in FIG. 11, and may be applied in various forms to various other electronic devices.

The display device accommodating unit 50 may include the display device 1 and the reflective member 40. An image displayed on the display device 1 may be reflected by the reflective member 40 and provided to a user's right eye through the right eye lens 10b. Accordingly, a user may view a virtual reality image displayed on the display device 1 through his/her right eye.

It has been illustrated in FIG. 11 that the display device accommodating unit 50 is disposed at a right distal end of the support frame 20, but one or more embodiments of the present disclosure are not limited thereto. For example, the display device accommodating unit 50 may be disposed at a left distal end of the support frame 20. In this case, an image displayed on the display device 1 may be reflected by the reflective member 40 and provided to a user's left eye through the left eye lens 10a. Accordingly, the user may view a virtual reality image displayed on the display device 1 through his/her left eye. Alternatively, the display device accommodating units 50 may be disposed at both the left and right distal ends of the support frame 20. In this case, the user may view a virtual reality image displayed on the display device 1 through both his/her left and right eyes.

Figure 12:
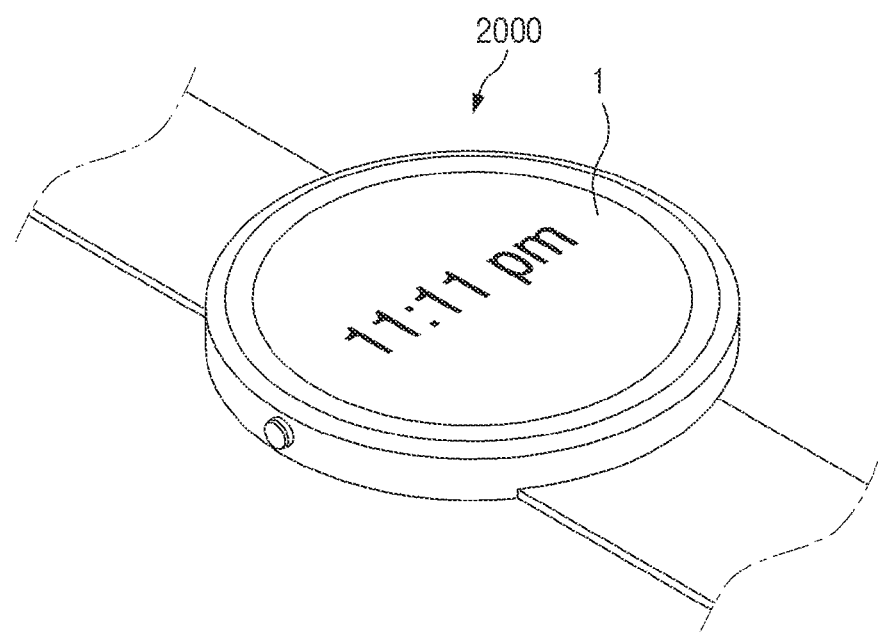
FIG. 12 is an illustrative view illustrating a smart device including a display device according to one or more embodiments of the present disclosure.

FIG. 12 is an illustrative view illustrating a smart device including a display device according to one or more embodiments.

Referring to FIG. 12, the display device 1 according to one or more embodiments may be applied to a smart watch 2000, which is one of the smart devices.

Figure 13:
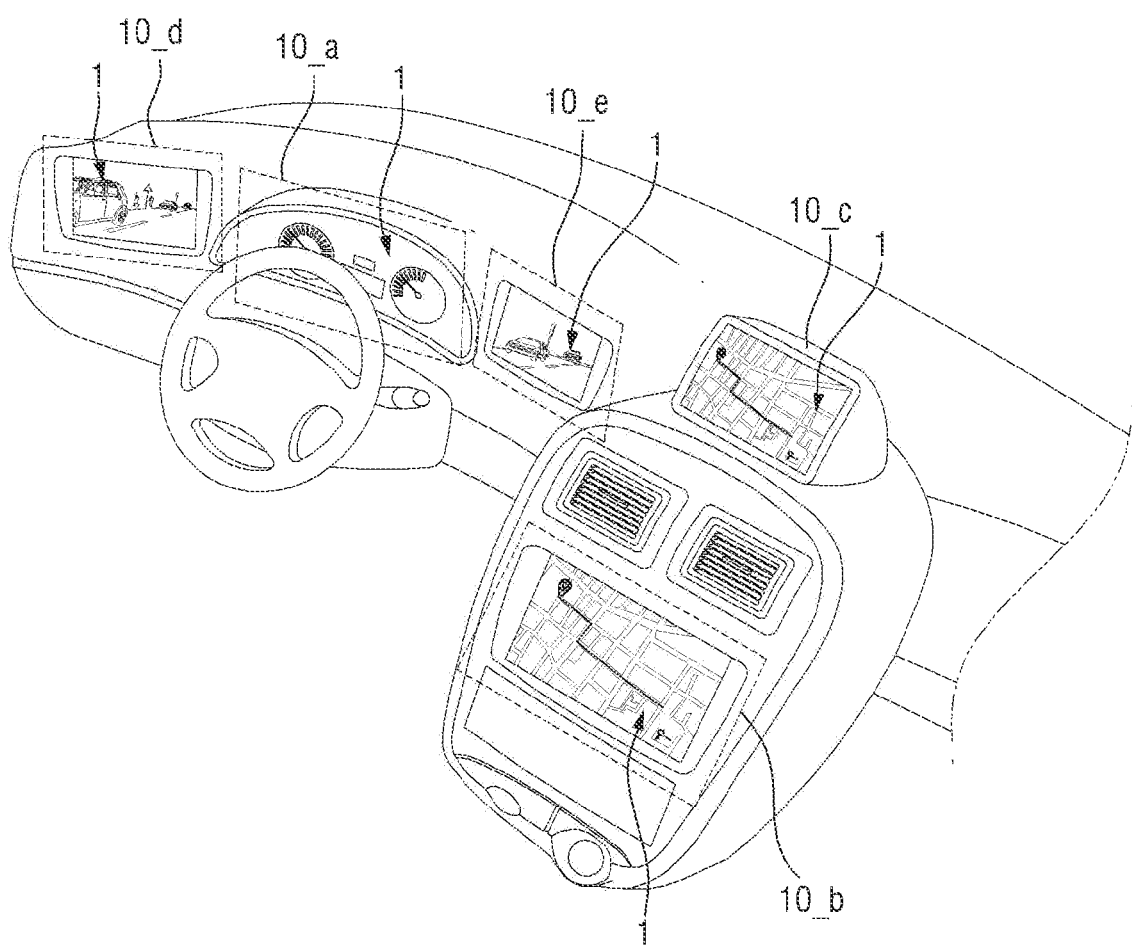
FIG. 13 is an illustrative view illustrating a vehicle including a display device according to one or more embodiments of the present disclosure.

FIG. 13 is an illustrative view illustrating a vehicle including a display device according to one or more embodiments.

A vehicle to which the display device 1 according to one or more embodiments is applied is illustrated in FIG. 13.

Referring to FIG. 13, the display device 1 according to one or more embodiments may be applied to an instrument board 10_a of the vehicle, applied to a center fascia 10_b of the vehicle, or applied to a center information display (CID) 10_c, 10_d, or 10_e disposed on a dashboard of the vehicle. In addition, the display device 1 according to one or more embodiments may be applied to a room mirror display substituting for a side mirror of the vehicle.

Figure 14:
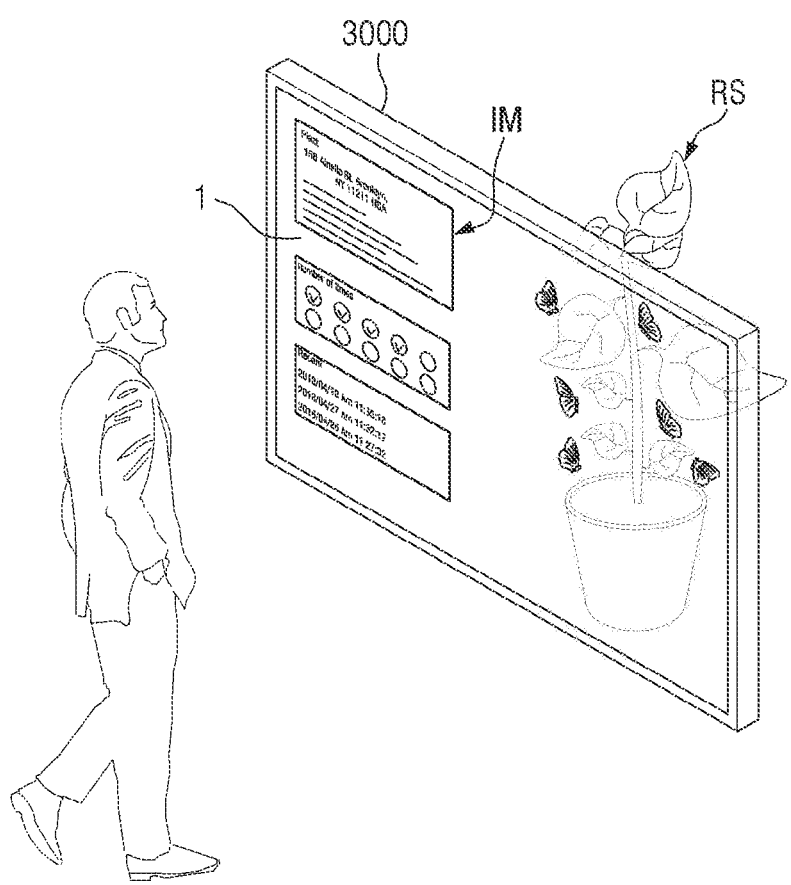
FIG. 14 is an illustrative view illustrating a transparent display device including a display device according to one or more embodiments of the present disclosure.

FIG. 14 is an illustrative view illustrating a transparent display device including a display device (e.g., the display device 1) according to one or more embodiments.

Referring to FIG. 14, the display device 1 according to one or more embodiments may be applied to a transparent display device 3000. The transparent display device 3000 may transmit light while displaying an image IM. Therefore, a user positioned at a front surface of the transparent display device 3000 may not only view the image IM displayed on the display device 1, but also see an object RS or a background positioned at a rear surface of the transparent display device 3000. When the display device 1 is applied to the transparent display device 3000, at least one layer (or member) constituting the display panel DP illustrated in FIG. 2 may include a light transmitting portion capable of transmitting light or may be made of a material capable of transmitting light.

However, the aspects and features of embodiments of the present disclosure are not restricted to the one set forth herein. The above and other aspects and features of embodiments of the present disclosure will become more apparent to one of daily skill in the art to which the present disclosure pertains by referencing the claims, with functional equivalents thereof to be included therein.

What is claimed is:

1. A display device comprising:
a display panel comprising first panel pads arranged along a plurality of rows, each of the plurality of rows extending in a first direction in a plan view;
wires extending in a second direction crossing the first direction, each of the wires comprising a first bonding portion attached to a corresponding one of the first panel pads; and
a first circuit board comprising first pads connected to the wires,
wherein the first panel pads in a first row of the plurality of rows in a plan view are exposed in the second direction between the first panel pads in a second row neighboring the first row of the plurality of rows.

2. The display device of claim 1, wherein the first panel pads in the first row and the first panel pads in the second row are arranged at a first pitch along the first direction.

3. The display device of claim 2, wherein the first pitch is equal to or smaller than twice a width of one of the first panel pads in the first direction.

4. The display device of claim 2, wherein the first pitch is equal to or smaller than twice a width of the first bonding portion in the first direction.

5. The display device of claim 2, wherein the first panel pads in the first row and the first panel pads in the second row nearest to the first panel pads in the first row are arranged at a second pitch along the first direction that is smaller than the first pitch.

6. The display device of claim 5, wherein the first pitch is twice the second pitch.

7. The display device of claim 5, wherein the second pitch is equal to or smaller than a width of one of the first panel pads in the first direction.

8. The display device of claim 1, wherein a gap between the first panel pads in the first row in the first direction and a gap between the first panel pads in the second row in the first direction are equal to or smaller than a width of one of the first panel pads.

9. The display device of claim 1, wherein a width of one of the first panel pads in the first direction is equal to or greater than a width of the first bonding portion in the first direction.

10. The display device of claim 1, wherein one of the first panel pads has a circular shape in a plan view.

11. The display device of claim 1, wherein one of the first panel pads has a rhombic shape in a plan view.

12. The display device of claim 1, wherein the first panel pads are arranged along a third row adjacent to the second row, and the second row is between the first row and the third row.

13. The display device of claim 12, wherein the first panel pads in the first row and the first panel pads in the third row are arranged at a same pitch.

14. The display device of claim 13, wherein the first panel pads in the second row are exposed in the second direction between the first panel pads in the first row and/or the first panel pads in the third row.

15. The display device of claim 1, wherein each of the wires comprises a connection portion connected to the first bonding portion, the connection portion having a loop shape on a cross-section.

16. The display device of claim 1, wherein the display panel comprises:
- a semiconductor circuit substrate comprising a plurality of pixel circuit units;
- a light emitting element layer on the semiconductor circuit substrate and comprising a plurality of light emitting elements; and
- a wavelength conversion substrate on the light emitting element layer.

17. The display device of claim 16, wherein each of the plurality of light emitting elements comprises:
- a first semiconductor layer;
- an active layer on the first semiconductor layer;
- a second semiconductor layer on the active layer; and
- a third semiconductor layer on the second semiconductor layer.

18. The display device of claim 1, wherein a distance from one of the first panel pads in the first row to a corresponding one of the first pads in the second direction is different from a distance from one of the first panel pads in the second row to a corresponding one of the first pads in the second direction.

19. The display device of claim 1, wherein a distance from one of the first panel pads in the first row to an edge of the display panel in the second direction is different from a distance from one of the first panel pads in the second row to the edge of the display panel in the second direction.

20. A display device comprising:
- first pads arranged along a first direction;
- first panel pads overlapping the first pads in a second direction crossing the first direction; and
- wires connecting the first panel pads and the first pads to each other,
- wherein the first panel pads are arranged so that at least a portion of a first panel pad of the first panel pads does not overlap an other first panel pad that is nearest to the first panel pad in the second direction, in a plan view.

* * * * *